(12) United States Patent
Hiyama et al.

(10) Patent No.: US 8,518,558 B2
(45) Date of Patent: Aug. 27, 2013

(54) ORGANIC ELECTROLUMINESCENT ELEMENT

(75) Inventors: Kunimasa Hiyama, Hachioji (JP);
Shigeru Kojima, Hachioji (JP)

(73) Assignee: Konica Minolta Holdings, Inc., Tokyo (JP)

( * ) Notice: Subject to any disclaimer, the term of this patent is extended or adjusted under 35 U.S.C. 154(b) by 423 days.

(21) Appl. No.: 12/450,389

(22) PCT Filed: Mar. 25, 2008

(86) PCT No.: PCT/JP2008/055531
§ 371 (c)(1),
(2), (4) Date: Sep. 23, 2009

(87) PCT Pub. No.: WO2008/120611
PCT Pub. Date: Oct. 9, 2008

(65) Prior Publication Data
US 2010/0045172 A1    Feb. 25, 2010

(30) Foreign Application Priority Data

Mar. 29, 2007 (JP) ................. 2007-087240

(51) Int. Cl.
*H01L 51/54* (2006.01)
(52) U.S. Cl.
USPC ........... 428/690; 428/917; 313/504; 313/506; 257/E51.044

(58) Field of Classification Search
None
See application file for complete search history.

(56) References Cited

U.S. PATENT DOCUMENTS

| | | | | |
|---|---|---|---|---|
| 5,503,910 A | * | 4/1996 | Matsuura et al. | 428/212 |
| 2001/0053462 A1 | * | 12/2001 | Mishima | 428/690 |
| 2005/0031903 A1 | * | 2/2005 | Park et al. | 428/690 |
| 2005/0100760 A1 | | 5/2005 | Yokoyama | |
| 2007/0001587 A1 | * | 1/2007 | Hatwar et al. | 313/504 |
| 2007/0188083 A1 | | 8/2007 | Iwakuma et al. | |
| 2007/0200124 A1 | | 8/2007 | Suzuri et al. | |
| 2008/0278066 A1 | * | 11/2008 | Spindler et al. | 313/504 |

FOREIGN PATENT DOCUMENTS

| | | |
|---|---|---|
| JP | 06-207170 A | 7/1994 |
| JP | 07-041759 A | 2/1995 |
| JP | 2003-068465 A | 3/2003 |
| JP | 2003-077674 A | 3/2003 |
| JP | 2006-040856 A | 2/2006 |
| WO | WO 2006/009024 A1 | 1/2006 |

OTHER PUBLICATIONS

M.A. Baldo et al, "Highly efficient phosphorescent emission from organic electroluminescent devices", Nature, Sep. 1998, pp. 151-154, vol. 395, Macmillan Publishers Ltd.
M.A. Baldo et al, "High-efficiency fluorescent organic light-emitting devices using a phosphorescent sensitizer", Nature, Feb. 2000, pp. 750-753, vol. 403, Macmillan Magazines Ltd.
Japanese Office Action (Notice of Reasons for Refusal) in JP 2009-507473, dated Jul. 30, 2012.

* cited by examiner

*Primary Examiner* — Marie R. Yamnitzky
(74) *Attorney, Agent, or Firm* — Holtz Holtz Goodman & Chick PC

(57) ABSTRACT

An organic electroluminescent element having at least an anode, a cathode, and a light-emitting layer held between the anode and the cathode on a substrate and emitting white light. The light-emitting layer consists of three or less layers, the light-emitting material contained entirely in the light-emitting layer consists of at least four kinds of light-emitting material having different emission maximum wavelengths ($\lambda$max). The four kinds of light emitting material have emission colors of blue, green, yellow red and red, and since one or more layers out of the three or less layers of the light-emitting layer contain two or more kinds of light-emitting material simultaneously, there is obtained an organic electroluminescent element excellent in color rendering and exhibiting high power efficiency in which variation in emission color is small even if current density varies.

7 Claims, 3 Drawing Sheets

LIGHT

LIGHT

ORGANIC ELECTROLUMINESCENT ELEMENT

This application is the United States national phase application of International Application PCT/JP2008/055531 filed Mar. 25, 2008.

TECHNICAL FIELD

The present invention relates to an organic electroluminescent element.

BACKGROUND

As a light emitting type electronic display device, electroluminescent displays (hereinafter abbreviated as ELD) are known. Elements constituting the ELD include an inorganic electroluminescent element (hereinafter also referred to as an inorganic EL element) and an organic electroluminescent element (hereinafter also referred to as an organic EL element). Though the inorganic EL elements have been employed as a flat type light source, a high voltage alternating current has been required to drive light emitting elements.

On the other hand, the organic electroluminescent element has a constitution in which a light emitting layer incorporating light emitting compounds is sandwiched between a cathode and an anode, and emits light utilizing release of light (fluorescence and phosphorescence) when excitons are deactivated, which excitons are generated by recombination of electrons and holes injected into the light emitting layer. The above element has attracted attention in view of the following points: it is capable of emitting light at a few to several ten volts, and further exhibits a wide viewing angle due to a self light emitting type, high visibility, and space saving and portability due to a complete thin layer type solid element.

Further, the organic electroluminescent element also exhibits a major feature that it is an area light source differing from conventionally employed main light sources such as a light emitting diode or a cold-cathode tube. Possible applications utilizing the above characteristic include light sources for lighting and backlight of various displays. In particular, it is appropriate to employ it as a backlight for liquid crystal full color displays, of which demand is markedly increasing over recent years.

When the organic electroluminescent elements are employed as the above lighting source or display backlight, they are employed as a light source emitting white or electric bulb color light (hereinafter together referred to as white).

In order to realize white light emission with the organic electroluminescent elements, there are methods such as a method which realizes white via color mixture by preparing in a single element a plurality of light emitting materials differing in their emitted light wavelength; a method which realizes white in such a manner that three colors, for example, blue, green, and red are separately coated and they are simultaneously emitted to make a mixture of the colors; and a method which realize white employing color conversion dyes (for example, a combination of a blue light emitting material and a color conversion fluorescent dye).

However, when consideration is made for various demands for the light source for lighting and backlight such as lower cost, higher productivity, and more convenient driving methods, the method which realizes white via color mixture by preparing in a single element a plurality of light emitting materials differing in emitted light wavelengths, is useful for these applications, and in recent years, research and development of the same have been increasingly conducted.

The methods which realize white based on the above method will further be detailed. The methods include a method which realizes white by employing in an element two different color light emitting materials, which are complementary colors each other, such as a blue light emitting material and a yellow light emitting material, and mixing their colors, and a method which realizes white by employing light emitting materials of three colors of blue, green, and red and mixing their colors.

For example, a method for preparing a white organic electroluminescent element is disclosed, in which doping is carried out employing three fluorescent materials of blue, green and red, exhibiting high efficiency as a light emitting material (for example, Patent documents 1 and 2).

However, above methods had problems that they not only give insufficient light emission efficiency, but also exhibit large fluctuations in light emission colors depending on electric current density.

Further, there is a system in which, in organic electroluminescent elements emitting white light, each of the layers differing in emitted light color is not in the form of an individual layer, but at least two color light emitting materials are made to coexist in a single layer, and two color lights are emitted via an energy transfer from a light emitting dopant with high light emitting energy to a light emitting dopant with a relatively low efficiency (for example, Patent documents 3 and 4).

The above method is one of the promising methods to prepare a white light emitting organic EL element, because the above method can reduce the number of organic layers and to decrease the employed amount of light emitting materials. The light emission efficiency has been increasing by the above methods, but they do not contribute to improvement in color rendition.

In the meantime, in recent years, other than the fluorescent materials, developments of phosphorescent compounds, by which organic electroluminescent elements exhibiting higher luminance can be obtained, have been energetically carried out (refer, for example, to Patent Document 4 and Non-Patent Documents 1 and 2).

The light emission from conventional phosphorescent materials is one from an excited singlet, and since a generation ratio of a singlet exciton to a triplet exciton is 1:3, a generation probability of light emitting exciton species is 25%. On the other hand, in case of phosphorescent light-emitting compounds which utilize light emission from excited triplet, since the upper limit of internal quantum efficiency becomes 100% by generation ratio of an exciton and an internal conversion of a singlet exciton to a triplet exciton, the light emission efficiency principally becomes at most 4 times compared to that of fluorescent light-emitting compounds.

However, regarding phosphorescent light-emitting compounds especially exhibiting blue light emission, there have been no compounds exhibiting excellent light emission efficiency and durability, in particular, a driving lifetime. As a result, heretofore, it has been difficult to develop practical organic electroluminescent elements employing blue phosphorescent light-emitting compounds.

Patent Document 1: Japanese Patent Application Publication (hereinafter also referred to as JP-A) No. 6-207170
Patent Document 2: JP-A No. 7-41759
Patent Document 3: JP-A No. 2003-68465
Patent Document 4: JP-A No. 2003-77674
Non-Patent Document 1: M. A. Baldo et al., Nature, Vol. 395, pages 151-154 Non-Patent Document 2: M. A. Baldo et al., Nature, Vol. 403, No. 17, pages 750-753

DISCLOSURE OF THE INVENTION

Issues to be Solved by the Invention

The present invention has been achieved in consideration of such problems, and it is an object of the invention to provide organic electroluminescent elements exhibiting excellent color rendering properties, and high electric power efficiency, and further, a small change of emitted light color even though an electric current density varies.

Measures to Solve the Issues

The above object has been achieved by the following constitutions.

1. An organic electroluminescent element which has, on a substrate, at least an anode, a cathode and a light emitting layer sandwiched between the aforesaid anode and cathode, and emits white light, wherein the aforesaid light emitting layer is composed of three layers or less, and light emitting materials incorporated in the above whole light emitting layer are at least four kinds of light emitting materials, each of which has a different light emission maximum wavelength ($\lambda$max).

2. The organic electroluminescent element described in the above Item 1, wherein each of the emitted light colors of the above four kinds of light emitting materials is blue, green, yellow-red, and red.

3. The organic electroluminescent element described in the above Item 2, wherein at least one layer of the above light emitting layers is doped with two kinds of light emitting materials of a green light emitting material and one of either a red light emitting material or a yellow-red light emitting material.

4. The organic electroluminescent element described in the above Items 2 or 3, wherein at least one layer of the above light emitting layers is doped with two kinds of light emitting materials of a blue light emitting material and one of either a red light emitting material or a yellow-red light emitting material.

5. The organic electroluminescent element described in any one of the above Items 1 to 4, wherein the blue light emitting material is a phosphorescent light-emitting compound exhibiting the light emission maximum wavelength of 480 nm or less and being represented by Formula (1) below.

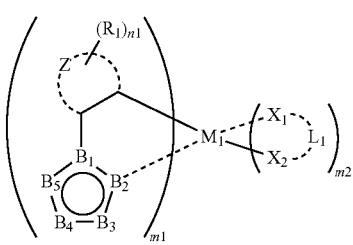

Formula (1)

(wherein $R_1$ represents a substituent; Z represents a non-metal atom group necessary to form a 5 to 7-membered ring; n1 represents an integer of 0 to 5; each of $B_1$ to $B_5$ independently represents a carbon atom, a nitrogen atom, an oxygen atom or a sulfur atom, provided that one of which represents a nitrogen atom; $M_1$ represents a metal of Groups 8 to 10 of the Periodic Table of the Elements; each of $X_1$ and $X_2$ independently represents a carbon atom, a nitrogen atom, or an oxygen atom; $L_1$, together with $X_1$ and $X_2$, represents a group of atoms to form a bidentate ligand; m1 is an integer of 1 to 3, and m2 is an integer of 0 to 2, provided that the sum of m1 and m2 is 2 or 3.)

6. The organic electroluminescent element described in any one of the above Items 1 to 3 and 5, wherein the above light emitting layer is constituted of three layers, and a green light emitting material and a red light emitting material are simultaneously incorporated in the light emitting layer located on the anode side of the blue light emitting layer incorporating a blue light emitting material, and a green light emitting material and a yellow-red light emitting material are simultaneously incorporated in the light emitting layer located on the cathode side of the aforesaid blue light emitting layer.

7. The organic electroluminescent element described in any one of the above Items 1 to 3 and 5, wherein the above light emitting layer is constituted of three layers, and a green light emitting material and a yellow-red light emitting material are simultaneously incorporated in the light emitting layer located on the anode side of the blue light emitting layer, and a green light emitting material and a red light emitting material are simultaneously incorporated in the light emitting layer located on the cathode side of the aforesaid blue light emitting layer.

8. The organic electroluminescent element described in any one of the above Items 1 to 7, wherein, in case where the element has a plurality of light emitting layers, the host materials incorporated in any light emitting layers are identical.

Effects of the Invention

According to the present invention, the organic electroluminescent elements exhibiting excellent color rendering properties, and high electric power efficiency, and further, a small change of emitted light color even though an electric current density varies could be provided.

DESCRIPTION OF ALPHANUMERIC DESIGNATIONS

Figure 1:
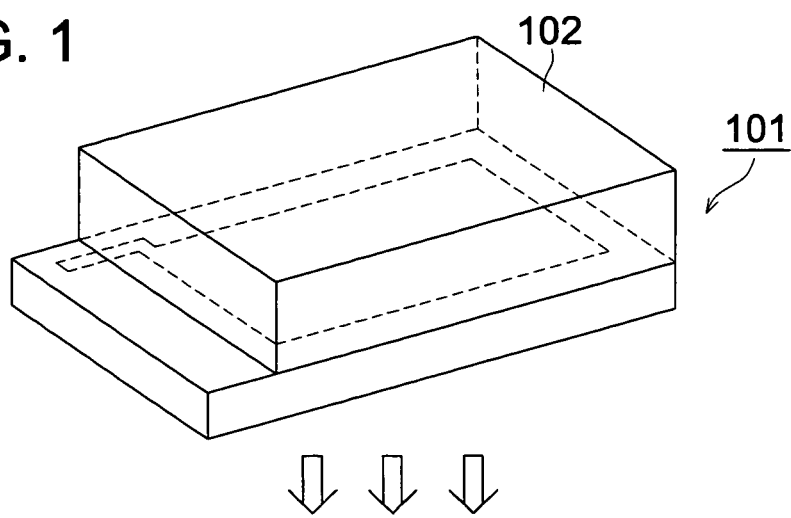
FIG. 1 is a schematic view of the lighting device.

1: a display
3: a pixel
5: a scanning line
6: a data line
7: a power supply line
10: an organic EL element
11: a switching transistor
12: a driving transistor
13: a condenser
A: a display section
B: a control section
102: a glass cover
105: a cathode
106: an organic EL layer
107: a glass base equipped with a transparent electrode
108: nitrogen gas
109: a moisture absorbing material

DESCRIPTION OF THE PREFERRED EMBODIMENTS

As a result of diligent examination, inventors of the present invention found that a phosphorescent light-emitting organic electroluminescent element exhibiting an improved durability was obtained by employing a phosphorescent light-emitting dopant exhibiting so-called blue light emission having the light emission maximum wavelength of 480 nm or less and being represented by above Formula (1).

However, in case of obtaining white light emission by a color mixing employing the above blue phosphorescent light-emitting compound and light emitting materials showing other colors, the above element is unsatisfactory one in terms of compatibility of the color rendering properties with the chromaticity stability during electric current density fluctuation. Then the present invention was achieved.

Hereinafter, details of each constitutional element of the light emitting organic electroluminescent element of the present invention (hereinafter also referred to as the organic EL element of the present invention) will be successively described.

<<Emitted Light Color and Front Luminance of Organic Electroluminescent Element>>

Figure 4:
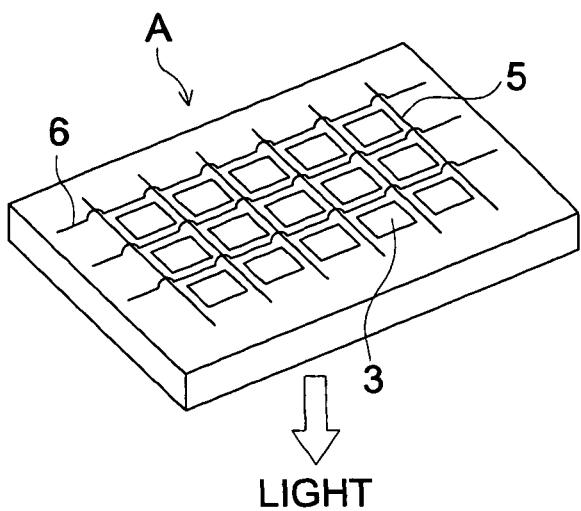
FIG. 4 is a schematic view of display section A.

The emitted light color of the organic EL element of the present invention or compounds relating to the aforesaid element is determined by a spectroradiometer CS-1000 (manufactured by Konica Minolta Sensing Inc.) and expressed according to CIE chromaticity diagram described in FIG. 4.16 on page 108 of "Shinpen Shikisai Kagaku Handbook" (Coloring Science Handbook, New Edition), edited by Nihon Shikisai Gakkai, published by Todai Shuppan Kai, 1985.

The preferable chromaticity as the white element in the present invention is within the range of x value being 0.37±0.1 and y value being 0.37±0.07 in the CIE 1931 color coordinate system.

<<Layer Constitution of Organic EL Element>>

Next, the preferred specific examples of the layer constitution of the organic EL element of the present invention are described below, but the present invention is not limited to them.

(i) an anode/a light emitting layer unit/an electron transporting layer/a cathode (ii) an anode/a hole transporting layer/a light emitting layer unit/an electron transporting layer/a cathode (iii) an anode/a hole transporting layer/a light emitting layer unit/a hole blocking layer/an electron transporting layer/a cathode (iv) an anode/a hole transporting layer/a light emitting layer unit/a hole blocking layer/an electron transporting layer/a cathode buffer layer/a cathode (v) an anode/a anode buffer layer/a hole transporting layer/a light emitting layer unit/a hole blocking layer/an electron transporting layer/a cathode buffer layer/a cathode <<Light Emitting Layer>>

The light emitting layer of the present invention is a layer which emits light by recombination of electrons and holes injected from electrodes, or from an electron transporting layer and a hole transporting layer, and the light emitting portion may within the light emitting layer or an interface between the light emitting layer and the adjacent layer.

The light emitting layer unit employed in the present invention is constituted of three layers or less, and at least four kinds of light emitting materials differing in light emission maximum wavelength from each other are incorporated in the whole light emitting layer unit. The emitted light colors of the four kinds of the light emitting materials are preferably four colors of blue, green, yellow-red, and red, and it is preferable that the above blue light emission maximum wavelength is in the range of 430 to 480 nm, the above green light emission maximum wavelength is in the range of 510 to 560 nm, the above yellow-red light emission maximum wavelength is in the range of 570 to 610 nm, and the above red light emission maximum wavelength is in the range of 610 to 650 nm. Further, the aforesaid unit may have a non-light emitting intermediate layers, which will be described later, between each of light emitting layers.

The light emitting layer unit of the present invention incorporates, as described above, at least four kinds of light emitting materials differing in light emission maximum wavelength from each other in the three light emitting layers or less, which results in that the light emitting layer unit has at least one light emitting layer which simultaneously incorporates two or more kinds of the light emitting materials.

Various combinations can be possible in cases where two or more kinds of light emitting materials differing in light emission maximum wavelength from each other are incorporated in a single layer, but preferable combinations are green and yellow-red, green and red, blue and yellow-red, and blue and red, more preferably green and yellow-red, or green and red.

The total thickness of the light emitting layers is not particularly limited, but is preferably controlled within a range of 2 to 200 nm from a view point of uniformity of the layer to be formed, prevention of applying an unnecessary high voltage during light emission, and improvement of the stability of an emitted light color against driving current, more preferably in the range of 5 nm or more and 40 nm or less. The thickness of each of the light emitting layers is preferably controlled within a range of 2 to 100 nm, more preferably in the range of 5 nm or more and 30 nm or less.

The light emitting layer may be prepared by forming a film of a light emitting dopant or a host compound to be described via commonly known thin film forming methods such as a vacuum vapor deposition method, a spin coat method, a casting method, the LB method (the Langmuir-Blodgett method) and an inkjet method.

Next, the light emitting dopant (also referred to as a light emitting dopant compound) or the host compound incorporated in the light emitting layer will be described.

(Light Emitting Dopant)

The light emitting dopant relating to the present invention will be described. As the light emitting dopant relating to the present invention, usable are a fluorescent compound and a phosphorescent substance (also referred to as a phosphorescent compound or a phosphorescent light-emitting compound). In view of obtaining organic EL elements exhibiting higher light-emitting efficiency, as the light emitting dopant employed in the light emitting layer of the organic EL element relating to the present invention, the phosphorescent substance is preferably incorporated.

In the invention relating to the above Item 5, there is incorporated at least a phosphorescent light-emitting compound exhibiting the light-emission maximum wavelength of 480 nm or less and being represented by above Formula (1). Further, it is more preferable that all of the light-emitting dopants incorporated in the element are phosphorescent light-emitting compounds.

The phosphorescent light-emitting compound (also referred to as a phosphorescent light-emitting dopant) represented by Formula (1) will be detailed hereinafter.

<<Phosphorescent Light-Emitting Compound Represented by Formula (1)>>

In the phosphorescent light-emitting compounds represented by above Formula (1) relating to the present invention, the substituents represented by $R_1$ include: an alkyl group (for example, a methyl group, an ethyl group, a propyl group, an isopropyl group, a tert-butyl group, a pentyl group, a hexyl group, an octyl group, a dodecyl group, a tridecyl group, a tetradecyl group and a pentadecyl group), a cycloalkyl group (for example, a cyclopentyl group and a cyclohexyl group), an alkenyl group (for example, a vinyl group and an allyl group), an alkynyl group (for example, an ethynyl group and a propargyl group), an aromatic hydrocarbon ring group (also referred to as an aromatic carbon ring group or an aryl group such as a phenyl group, a p-chlorophenyl group, a mesityl group, a tolyl group, a xylyl group, a naphthyl group, an anthryl group, an azulenyl group, an acenaphthenyl group, fluorenyl group, a phenanthryl group, an indenyl group, a pyrenyl group, or a biphenyl group), an aromatic heterocyclic group (for example, a pyridyl group, a pyrimidinyl group, a furyl group, a pyrrolyl group, an imidazolyl group, a benzimidazolyl group, a pyrazolyl group, a piradinyl group, a triazolyl group (for example, an 1,2,4-triazole-1-yl group and an 1,2,3-triazole-1-yl group), an oxazolyl group, a benzoxazolyl group, a thiazolyl group, an isooxazolyl group, an isothiazolyl group, a furazanyl group, a thienyl group, a quinolyl group, a benzofuryl group, a dibenzofuryl group, a benzothienyl group, a dibenzothienyl group, an indolyl group, a carbazolyl group, a carbolynyl group, a diazacarbazoyl group (a group in which any one of the carbon atoms constituting a carboline ring of the above carbolinyl group is replaced with a nitrogen atom), a quinoxythalinyl group, a pyridazinyl group, a triazinyl group, a quinazolinyl group, a phthalazinyl group), a heterocyclic group (for example, a pyrrolidyl group, an imidazolidyl group, a morpholyl group, and an oxazolidyl group), an alkoxyl group (for example, a methoxy group, an ethoxy group, a propyloxy group, a pentyloxy group, a hexyloxy group, an octyloxy group and a dodecyloxy group), a cycloalkoxy group (for example, a cyclopentyloxy group and a cyclohexyloxy group), an aryloxy group (for example, a phenoxy group and a naphthyloxy group), an alkylthio group (for example, a methylthio group, an ethylthio group, a propylthio group, a pentylthio group, a hexylthio group, an octylthio group and a dodecylthio group), a cycloalkylthio group (for example, a cyclopentylthio group and a cyclohexylthio group), an arylthio group (for example, a phenylthio group and a naphthylthio group), an alkoxycarbonyl group (for example, a methyloxycarbonyl group, an ethyloxycarbonyl group, a butyloxycarbonyl group, an octyloxycarbonyl group and a dodecyloxycarbonyl group), an aryloxycarbonyl group (for example, a phenyloxycarbonyl group and a naphthyloxycarbonyl group), a sulfamoyl group (for example, an aminosulfonyl group, a methylaminosulfonyl group, a dimethylaminosulfonyl group, a butylaminosulfonyl group, a hexylaminosulfonyl group, a cyclohexylaminosulfonyl group, an octylaminosulfonyl group, a dodecylaminosulfonyl group, a phenylaminosulfonyl group, a naphthylamino sulfonyl group and a 2-pyridylaminosulfonyl group), an acyl group (for example, an acetyl group, an ethylcarbonyl group, a propylcarbonyl group, a pentylcarbonyl group, a cyclohexylcarbonyl group, an octylcarbonyl group, a 2-ethylhexylcarbonyl group, a dodecylcarbonyl group, a phenyl carbonyl group, a naphthylcarbonyl group and a pyridylcarbonyl group), an acyloxy group (for example, an acetyloxy group, an ethylcarbonyloxy group, a butylcarbonyloxy group, an octylcarbonyloxy group, a dodecylcarbonyloxy group and a phenylcarbonyloxy group), an amide group (for example, a methylcarbonylamino group, an ethylcarbonylamino group, a dimethylcarbonylamino group, a propylcarbonylamino group, a pentylcarbonylamino group, a cyclohexylcarbonylamino group, a 2-ethylhexylcarbonylamino group, an octylcarbonylamino group, a dodecylcarbonylamino group, a phenylcarbonylamino group and a naphthylcarbonylamino group), a carbamoyl group (for example, an aminocarbonyl group, a methylaminocarbonyl group, a dimethylaminocarbonyl group, a propylaminocarbonyl group, a pentylaminocarbonyl group, a cyclohexylaminocarbonyl group, an octylaminocarbonyl group, a 2-ethylhexylaminocarbonyl group, a dodecylaminocarbonyl group, a phenylaminocarbonyl group, a naphthylaminocarbonyl group and a 2-pyridylaminocarbonyl group), a ureido group (for example, a methylureido group, an ethylureido group, a pentylureido group, a cyclohexylureido group, an octylureido group, a dodecylureido group, a phenylureido group, a naphthylureido group and a 2-pyridylaminoureido group), a sulfinyl group (for example, a methylsulfinyl group, an ethylsulfinyl group, a butylsulfinyl group, a cyclohexylsulfinyl group, a 2-ethylhexylsulfinyl group, a dodecylsulfinyl group, a phenylsulfinyl group, a naphthylsulfinyl group and a 2-pyridylsulfinyl group), an alkylsulfonyl group (for example, a methylsulfonyl group, an ethylsulfonyl group, a butylsulfonyl group, a cyclohexylsulfonyl group, a 2-ethylhexylsulfonyl group and a dodecylsulfonyl group), an arylsulfonyl group or a heteroarylsulfonyl group (for example, a phenylsulfonyl group, a naphthylsulfonyl group and a 2-pyridylsulfonyl group), an amino group (for example, an amino group, an ethylamino group, a dimethylamino group, butylamino group, a cyclopentylamino group, a 2-ethylhexylamino group, a dodecylamino group, an anilino group, a naphthylamino group and a 2-pyridylamino group), a cyano group, a nitro group, a hydroxyl group, a mercapto group, and a silyl group (for example, a trimethylsilyl group, a triisopropylsilyl group, a triphenylsilyl group, and a phenyldiethylsilyl group).

Of these substituents, an alkyl group or an aryl group is preferred.

Z represents a non-metal atom group necessary to form a 5 to 7-membered ring. Examples of 5 to 7-membered ring formed by Z include a benzene ring, a naphthalene ring, pyridine ring, a pyrimidine ring, a pyrrole ring, a thiophene ring, a pyrazole ring, an imidazole ring, an oxazole ring, and a thiazole ring. Of these, a benzene ring is preferred.

Each of $B_1$ to $B_5$ independently represents a carbon atom, a nitrogen atom, an oxygen atom, or a sulfur atom, and at least one of B to $B_5$ is a nitrogen atom. As a nitrogen-containing aromatic heterocycle formed by these five atoms, a monocycle is preferred. Examples thereof include a pyrrole ring, a pyrazole ring, an imidazole ring, a triazole ring, a tetrazole ring, an oxazole ring, an isooxazole ring, a thiazole ring, an isothiazole ring, an oxadiazole ring, and a thiadiazole ring. Of these, the preferable rings are a pyrazole ring and an imidazole ring, and more preferable is an imidazole ring.

The above rings may be further substituted with the above-described substituent. The preferable substituents are an alkyl group and an aryl group, and more preferable is an aryl group.

$L_1$, together with $X_1$ and $X_2$, represents an atom group necessary to form a bidentate ligand. Specific examples of the bidentate ligand, represented by $X_1$-$L_1$-$X_2$, include substituted or non-substituted, phenylpyridine, phenylpyrazole, phenylimidazole, phenyltriazole, phenyltetrazole, pyrazabole, picolinic acid, and acetylacetone.

The above groups may be further substituted with the above-described substituent.

m1 is an integer of 1 to 3, and m2 is an integer of 0 to 2, provided that the sum of m1 and m2 is 2 or 3. Of these, m2 is preferably 0.

As a metal represented by $M_1$, a transition metal element (also simply referred to as a transition metal) of Group 8 to 10 of the Periodic Table of the Elements is employed, of which iridium and platinum are preferred, and iridium is more preferred.

The phosphorescent light-emitting compound represented by Formula (1) relating to the present invention may or may not have a polymerizable group or a reactive group.

In the above-described Formula (1), the nitrogen-containing heterocycle formed by $B_1$ to $B_5$ is preferably an imidazole ring.

In case where the nitrogen-containing heterocycle formed by $B_1$ to $B_5$ is the imidazole ring, the above-described Formula (1) is more preferably represented by Formula (2) below.

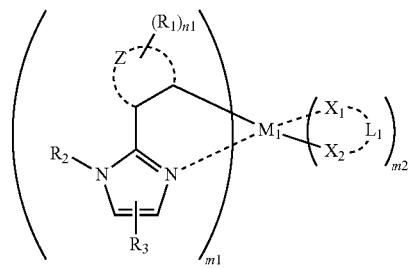

Formula (2)

In Formula (2), substituents represented by $R_1$, $R_2$, and $R_3$ are the same as those represented by $R_1$ in the above-described Formula (1). Further, Z, $M_1$, $X_1$, $X_2$, $L_1$, and the like of Formula (2) are also the same as those used in Formula (1). m1 and m2 are also the same as those used in Formula (1).

A group represented by $R_2$ of Formula (2) is preferably an aromatic hydrocarbon ring group (an aromatic carbon ring group), of which a substituted aryl group is preferred. As the substituted aryl group, a group represented by Formula (3) below is preferred.

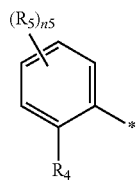

Formula (3)

In Formula (3), $R_4$ represents a substituent having a steric parameter value (an Es value) of −0.5 or less, $R_5$ is the same as $R_1$, and n5 represents an integer of 0 to 4. The asterisk "*" in the Formula indicates a bonding position.

The Es value denotes a "steric parameter" derived from a chemical reactivity. It can be said that the smaller the value, the larger the steric size of the substituent.

The Es value is explained as follows: It is known that, in general, in a hydrolysis reaction of an ester under an acidic condition, the influence that a substituent exerts on the progress of the reaction can be considered to be only a steric hindrance. Utilizing the above phenomenon, the steric hindrance of a substituent is numerically converted into the Es value.

For example, the Es value of a substituent X may be obtained as follows: Reaction rate constant kX of the following chemical reaction in which α-position mono-substituted acetate, which, is derived from α-position mono-substituted acetic acid prepared by substituting one hydrogen atom of the methyl group of acetic acid with substituent X, undergoes hydrolysis under acidic conditions, is obtained.

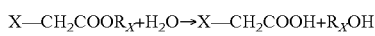

Reaction rate constant kH of the following reaction ($R_X$ is the same as $R_Y$) in which acetate corresponding to the above α-position mono-substituted acetate undergoes hydrolysis under acetic conditions, is also obtained.

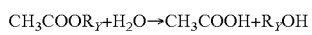

Subsequently, Es is obtained via the following formula.

$Es = \log(kX/kH)$

The reaction rate decreases due to steric hindrance of substituent X. As a result, since kX<kH is held, the Es value commonly becomes negative. When Es value is practically obtained, above two reaction rate constants, kX and kH, are determined, and then the Es value is calculated based on the above formula.

Specific examples of the Es value are detailed in Unger, S. H., Hansch, C., Prog. Phys. Org. Chem. 12, 91 (1976). Further, specific numerical values are also described in "Yakubutsu no Kozo Kassei Sokan (Structural Activity Correlation)" (Kagaku no Ryoiki Zokan No. 122, Nanko Do), and "American Chemical Society Professional Reference Book, 'Exploring QSAR' p. 81, Table 3-3". Some of the values are given in Table 1.

TABLE 1

| Substituent | Es value |
| --- | --- |
| H | 0 |
| F | −0.46 |
| Cl | −0.97 |
| Br | −1.16 |
| I | −1.4 |
| $CH_3$ | −1.24 |
| $C_2H_5$ | −1.31 |
| n-$C_3H_7$ | −1.6 |
| n-$C_4H_9$ | −1.63 |
| i-$C_4H_9$ | −2.17 |
| s-$C_4H_9$ | −2.37 |
| t-$C_4H_9$ | −2.78 |
| cyclo-$C_4H_7$ | −1.3 |
| n-$C_5H_{11}$ | −1.64 |
| i-$C_5H_{11}$ | −1.59 |
| $CH(C_2H_5)_2$ | −3.22 |
| cyclo-$C_6H_{11}$ | −2.03 |
| $CH_2F$ | −1.48 |
| $CH_2Cl$ | −1.48 |
| $CH_2Br$ | −1.51 |
| $CH_2I$ | −1.61 |
| $CH_2OH$ | −1.21 |
| $CH_2OCH_3$ | −1.43 |
| $CH_2NO_2$ | −2.71 |
| $CH_2COCH_3$ | −1.99 |
| $CHF_2$ | −1.91 |
| $CHCl_2$ | −2.78 |
| $CHBr_2$ | −3.1 |
| $CHOHCH_3$ | −1.15 |
| $CF_3$ | −2.4 |
| $CCl_3$ | −3.3 |
| $CBr_3$ | −3.67 |
| $C(C_6H_5)_3$ | −5.92 |
| $CHCH_3$ | −2.84 |
| CN | −0.51 |
| OH | −0.55 |
| $OCH_3$ | −0.55 |

TABLE 1-continued

| Substituent | Es value |
| --- | --- |
| SH | −1.07 |
| SCH₃ | −1.07 |
| SF₅ | −2.91 |
| NH₂ | −0.61 |

It should be noted that the Es value defined in the present specification is not defined when the Es value of a methyl group is 0, but is defined when that of a hydrogen atom is 0, whereby the Es values in Table 1 are obtained by subtracting 1.24 from the Es values where that of a methyl group being 0.

In the present invention, $R_4$ is a substituent having an Es value of −0.5 or less, preferably −7.0 or more and −0.6 or less, and most preferably −7.0 or more and −1.0 or less.

Further, in the present invention, in case where, for example, keto-enol tautomers are present in $R_4$, the Es value is converted with the keto portion being taken as an enol isomer. In cases where other tautomers are present, the Es values are converted based on the same conversion method.

Specific examples of the phosphorescent light-emitting compounds of the present invention represented by Formula (1) or (2) are shown below. However, the present invention is not limited by them.

1-1

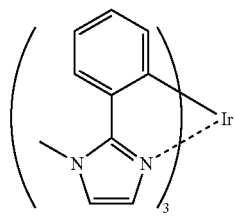

1-2

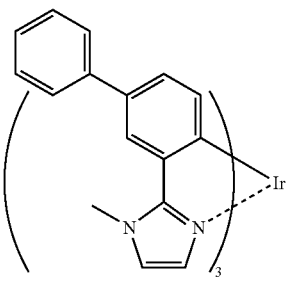

1-3

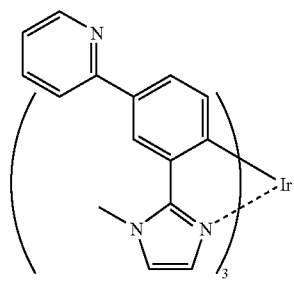

1-4

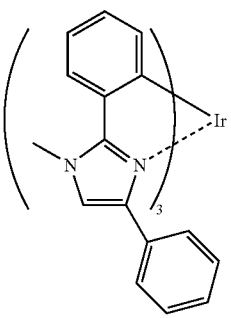

1-5

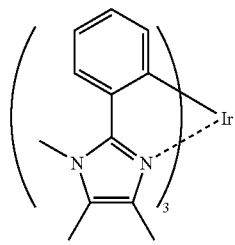

1-6

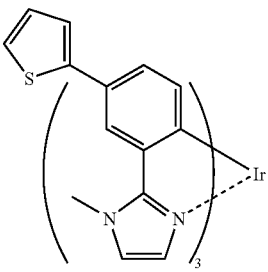

1-7

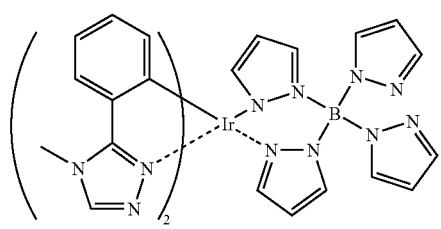

1-8

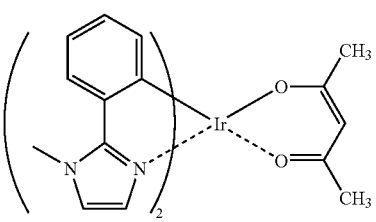

-continued
1-9
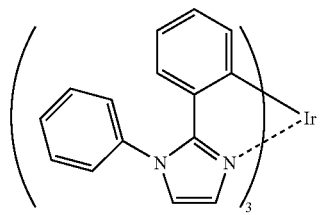
1-10
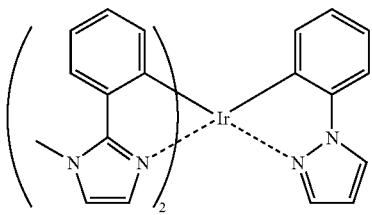
1-11
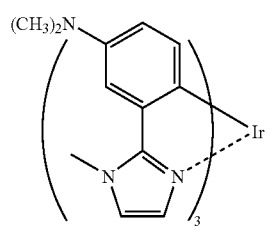
1-12
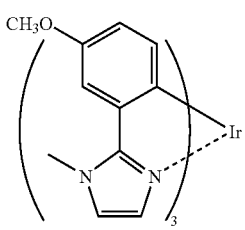
1-13
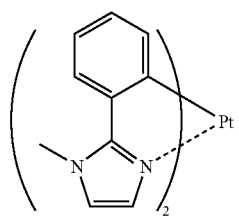
1-14
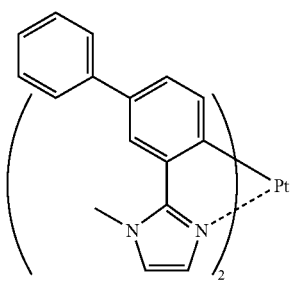
1-15
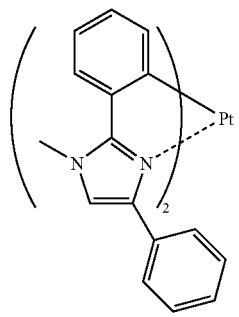
1-16
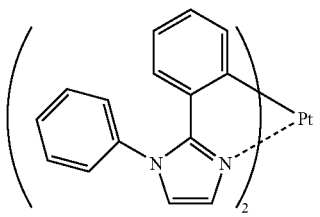
1-17
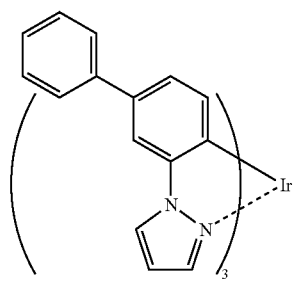
1-18
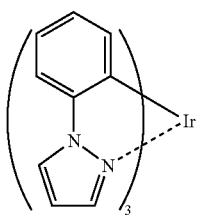
1-19
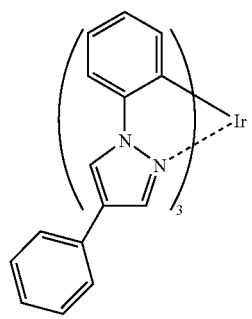
1-20
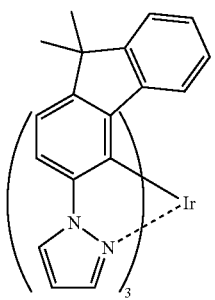

-continued
1-21
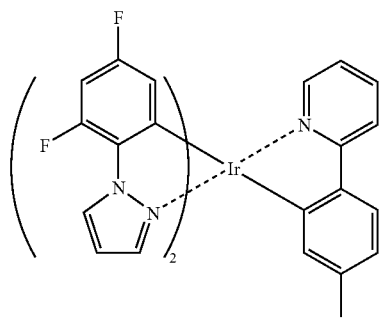
1-22
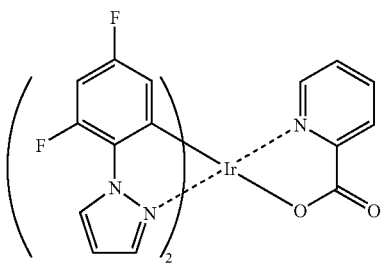
1-23
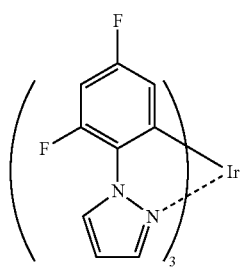
1-24
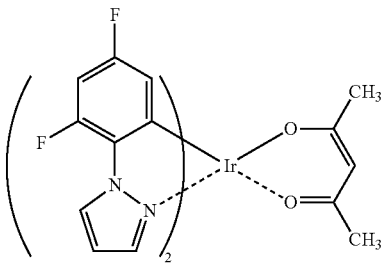
1-25
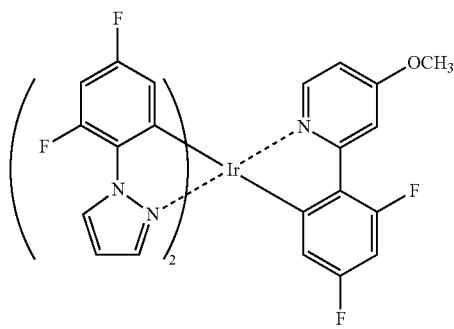
1-26
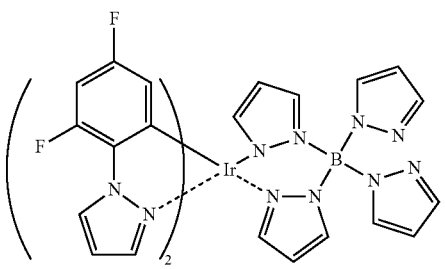
1-27
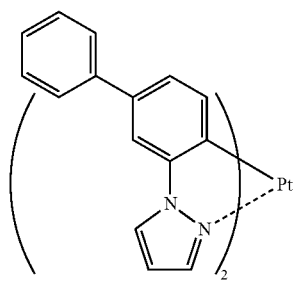
1-28
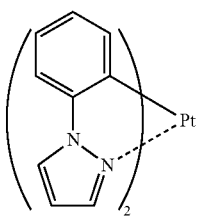
1-29
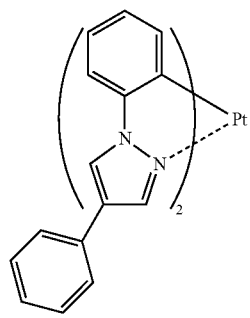
1-30
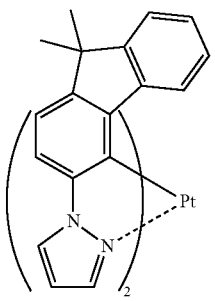

-continued
1-31
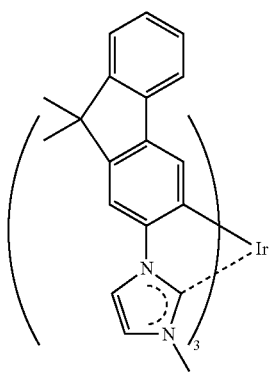
1-32
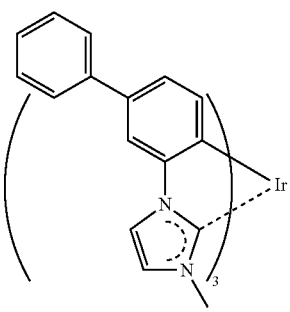
1-33
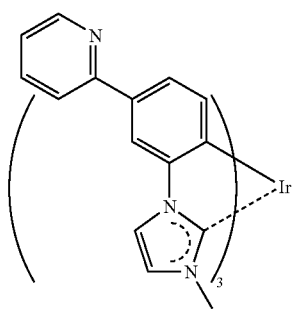
1-34
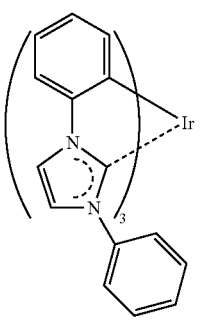
1-35
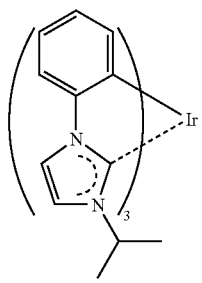
1-36
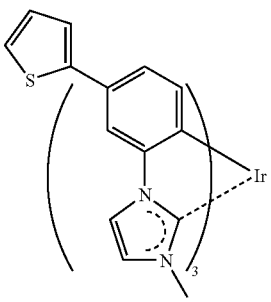
1-37
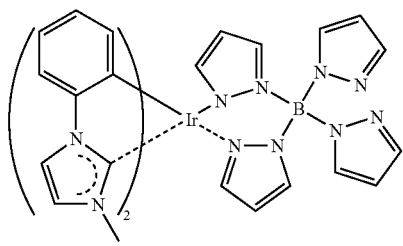
1-38
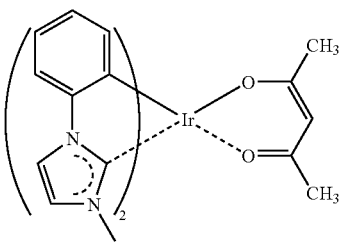
1-39
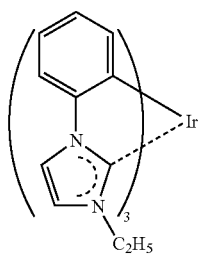
1-40
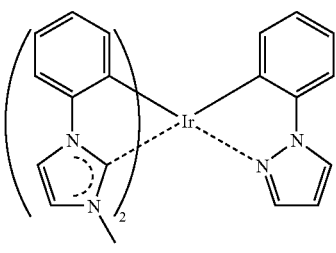

-continued
| | |
|---|---|
| 1-41 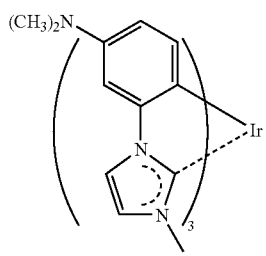 | 1-42 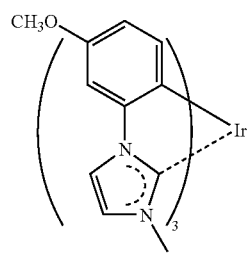 |
| 1-43 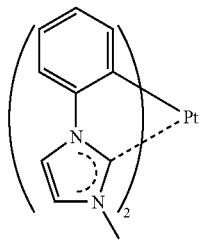 | 1-44 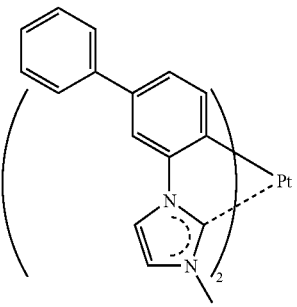 |
| 1-45 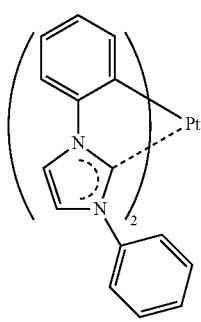 | 1-46 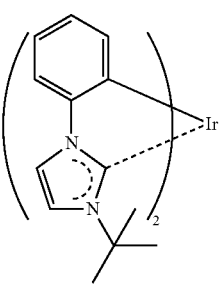 |
| 1-47 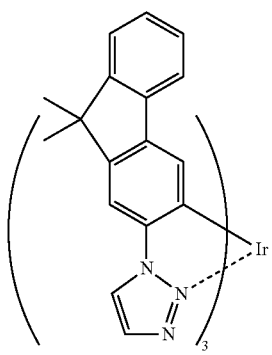 | 1-48 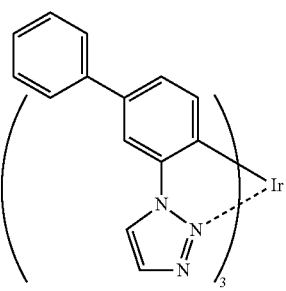 |
| 1-49 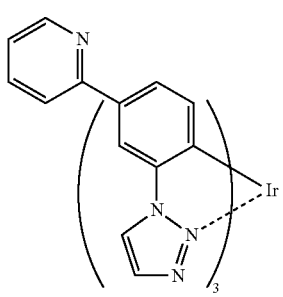 | 1-50 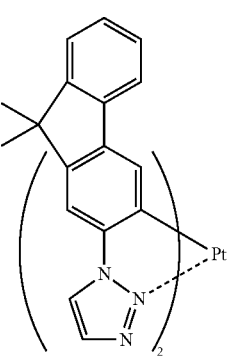 |

-continued
| 1-51 | 1-52 |
|---|---|
| 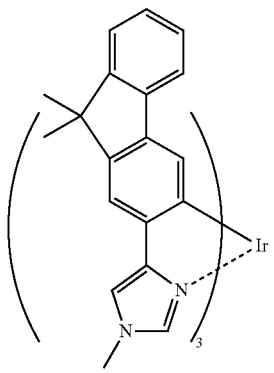 | 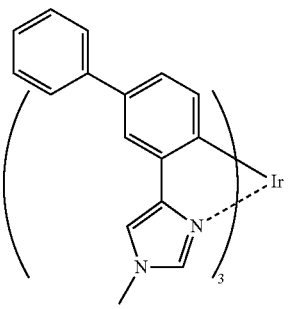 |
| 1-53 | 1-54 |
| 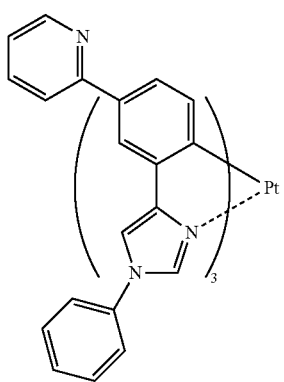 | 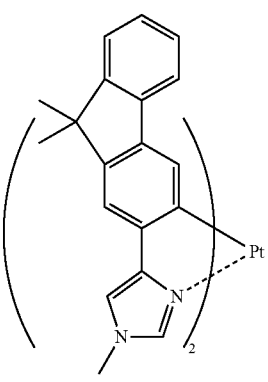 |
| 1-55 | 1-56 |
| 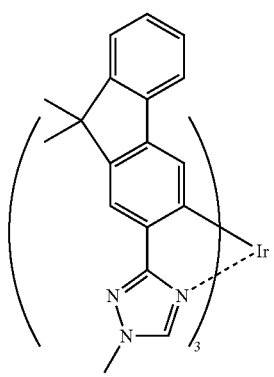 | 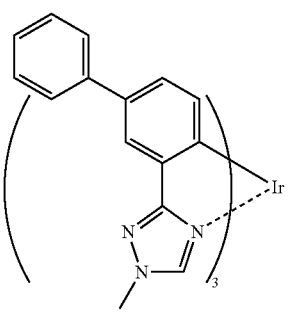 |
| 1-57 | 1-58 |
| 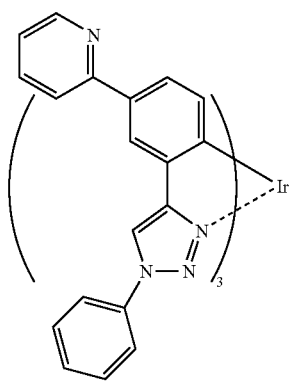 | 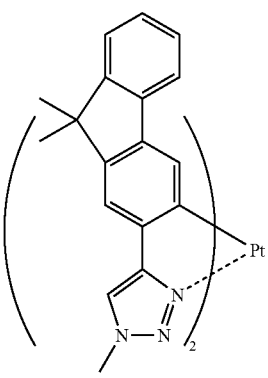 |

-continued
1-59
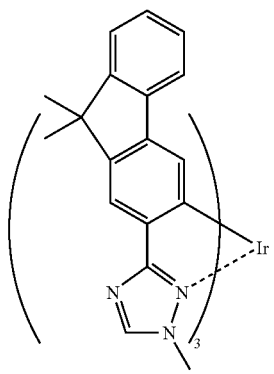
1-60
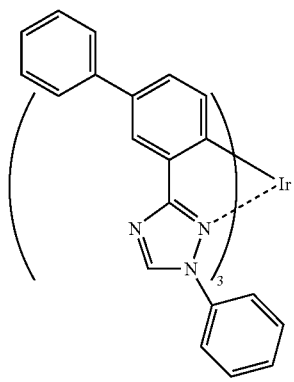
1-61
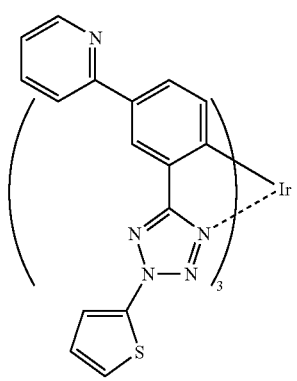
1-62
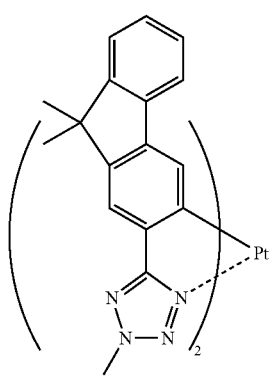
1-63
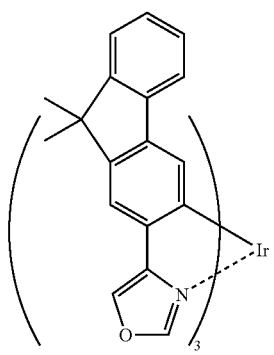
1-64
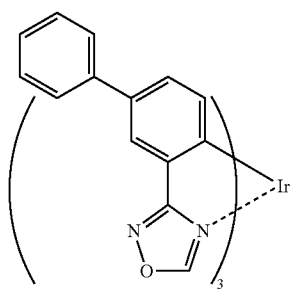
1-65
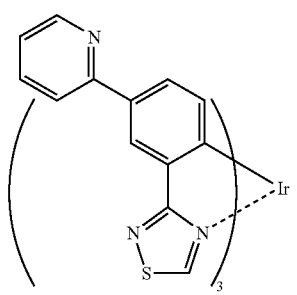
1-66
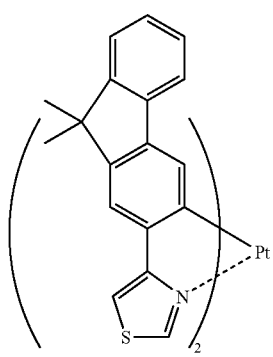

-continued
1-67
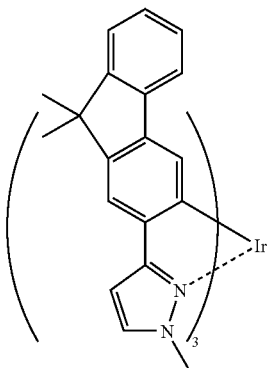
1-68
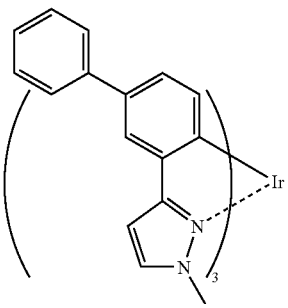
1-69
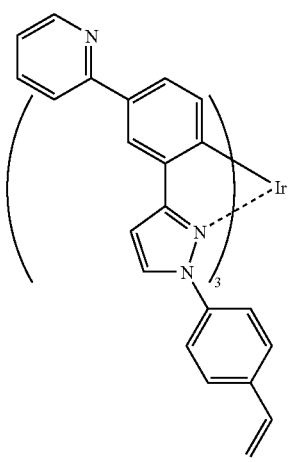
1-70
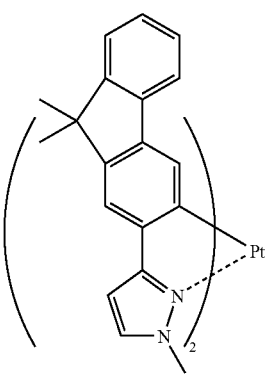
1-71
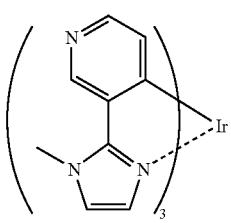
1-72
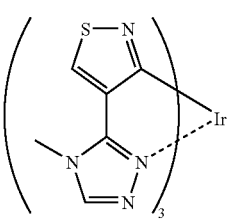
1-73
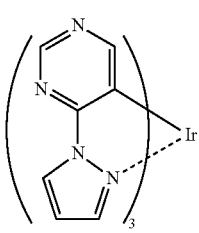
1-74
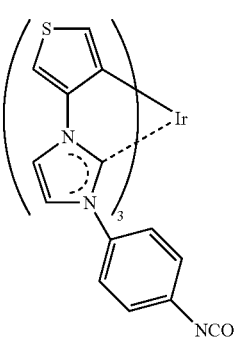

-continued
1-75
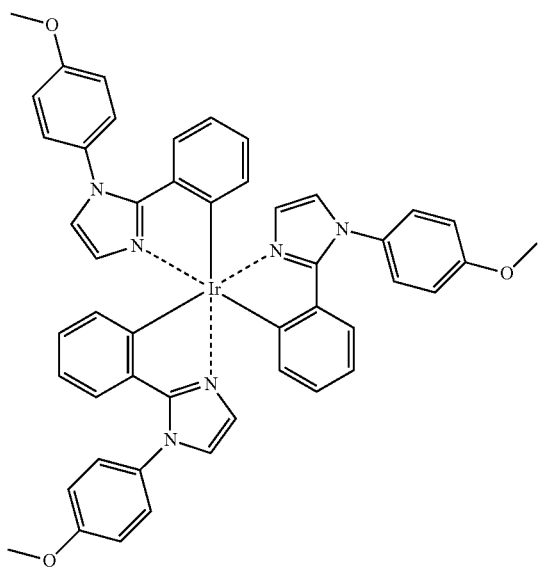
1-76
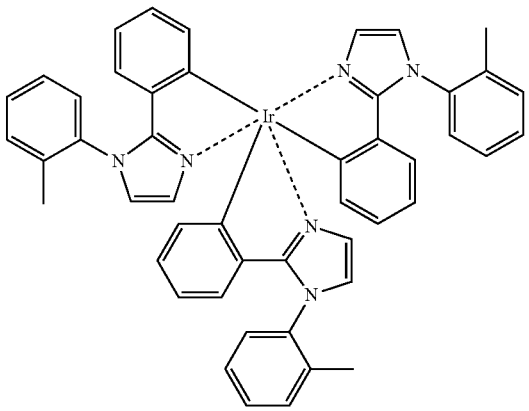
1-77
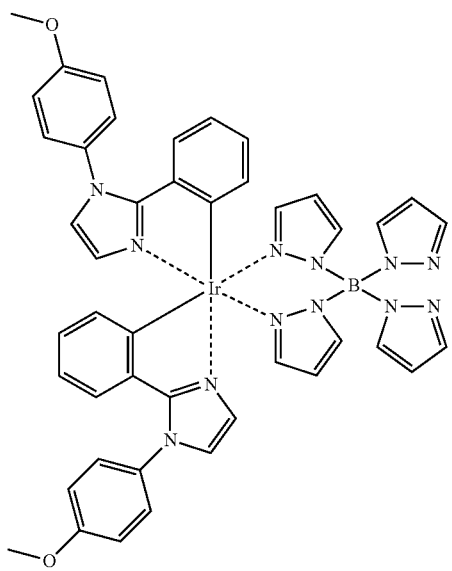
1-78
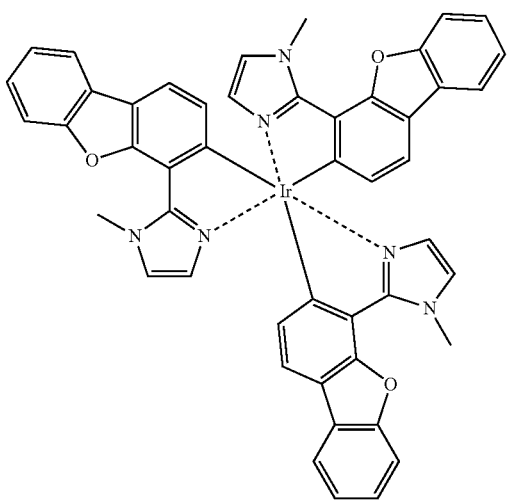
1-79
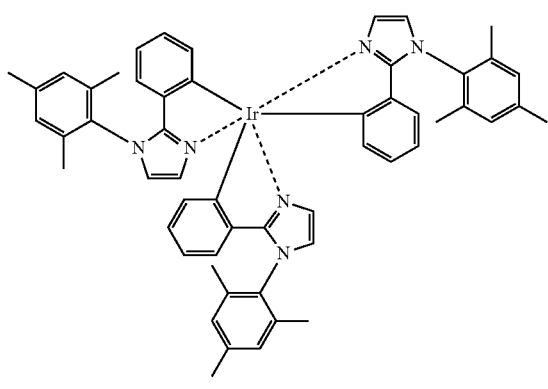
1-80
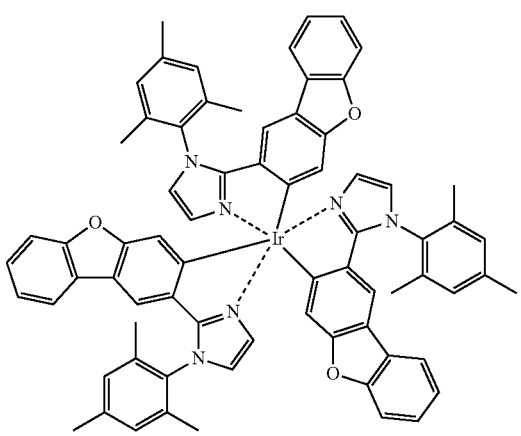

-continued
1-81
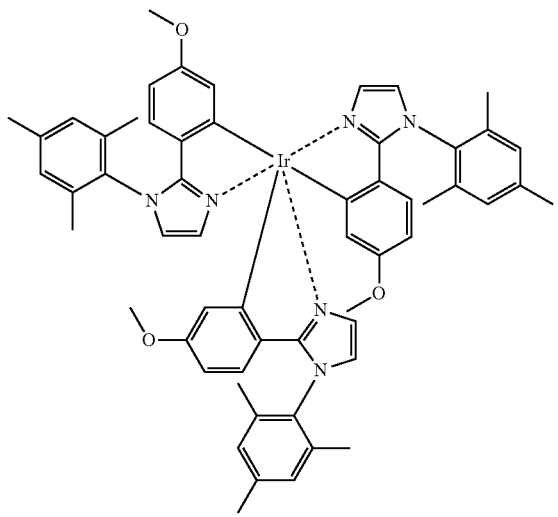
1-82
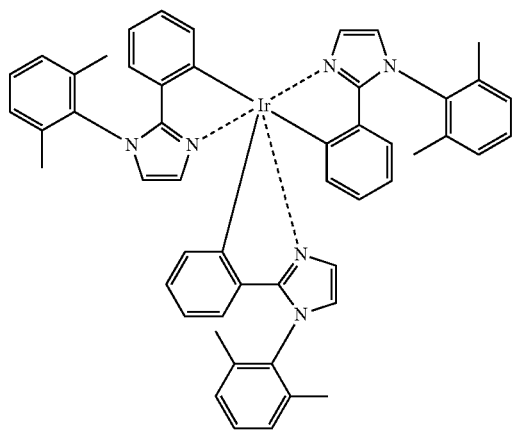
1-83
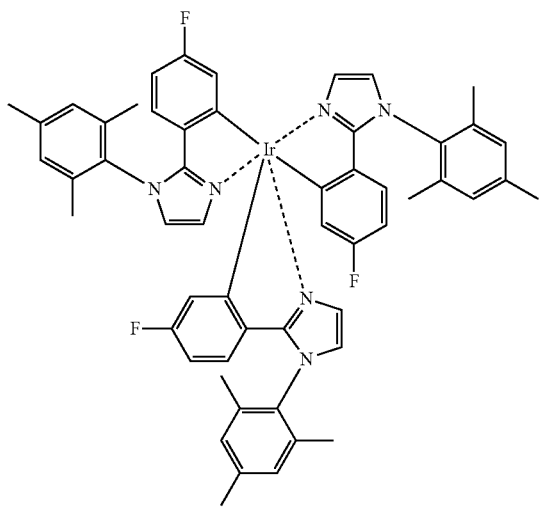
1-84
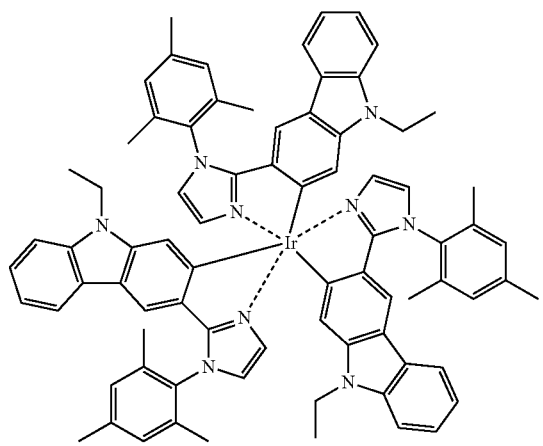
1-85
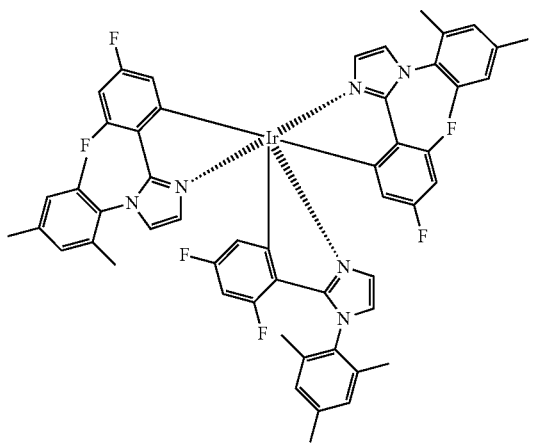
1-86
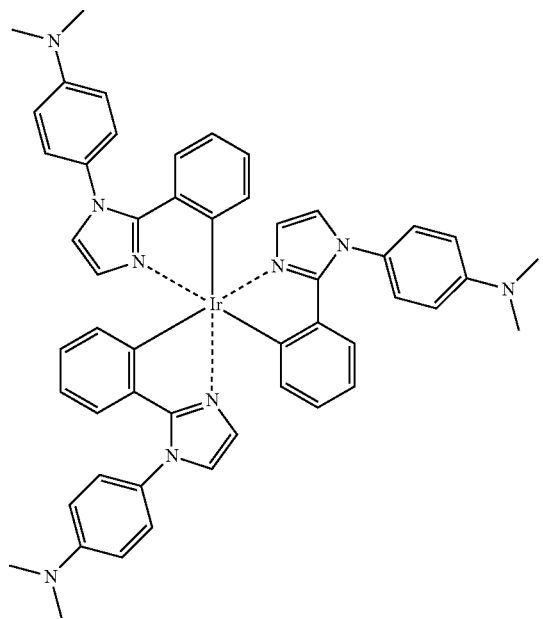

-continued
1-87
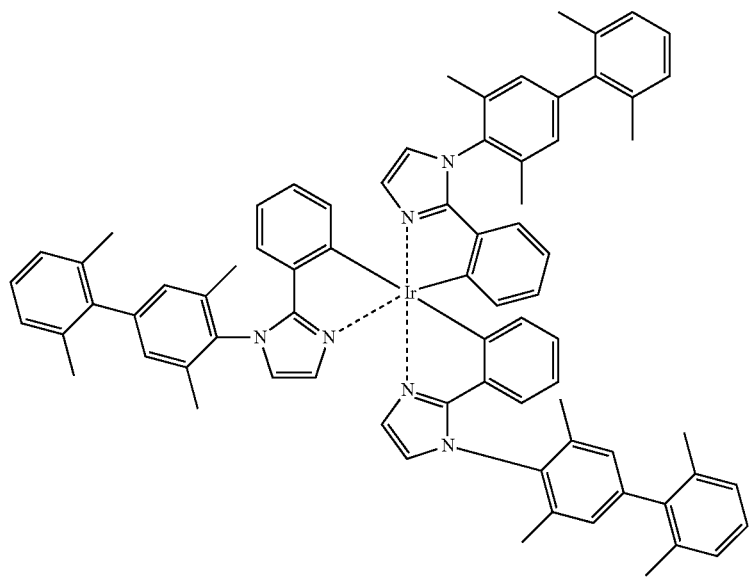
1-88
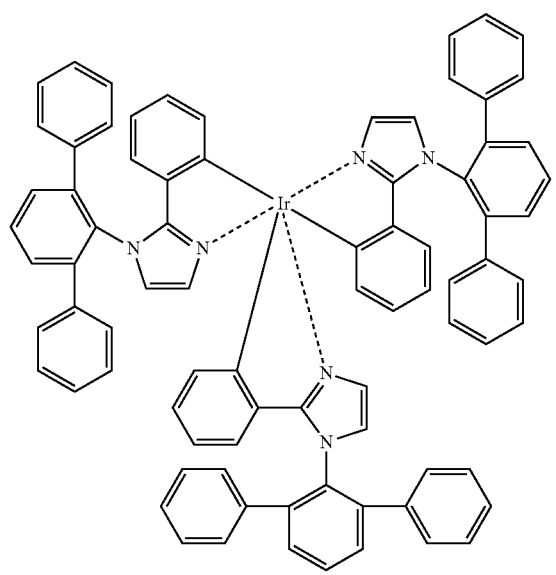
1-89
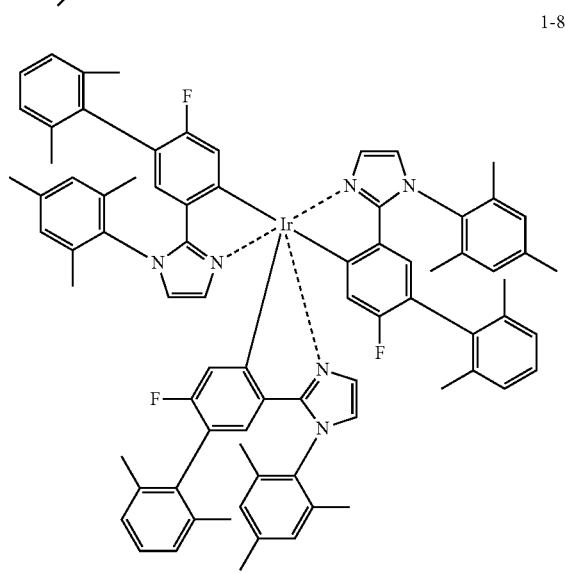
1-90
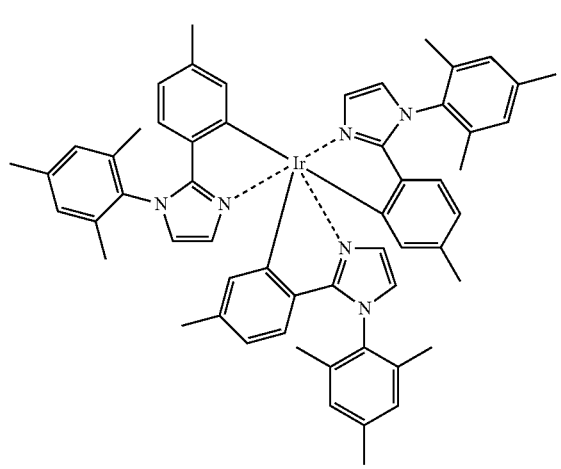

-continued
1-91
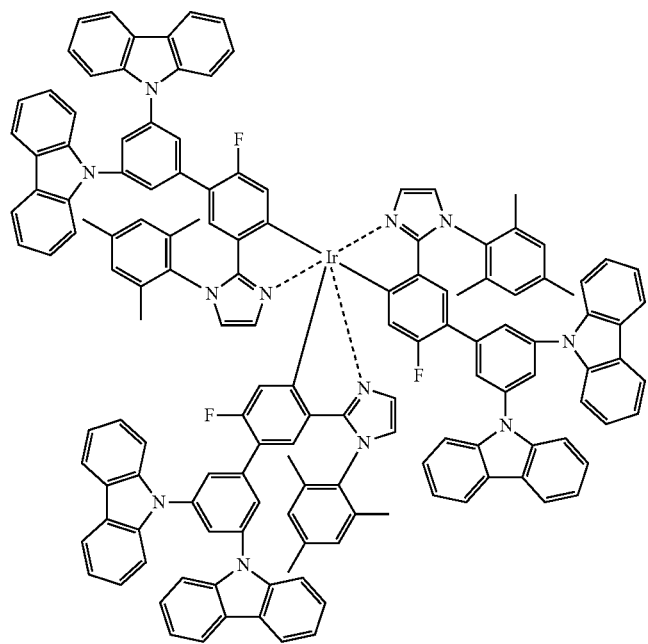
1-92
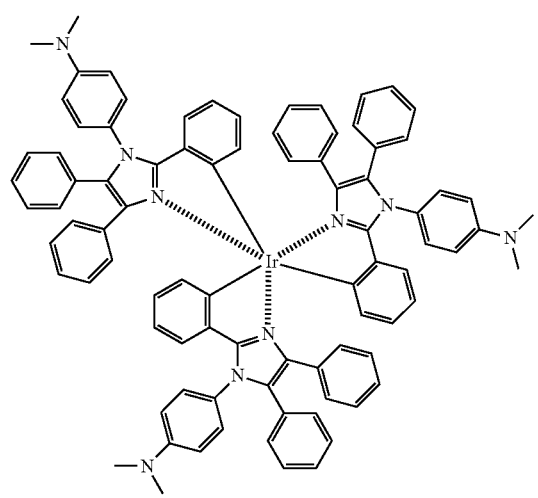
1-93
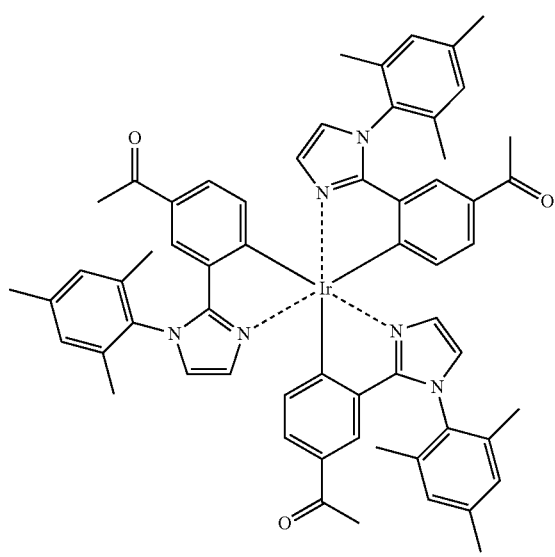

1-94
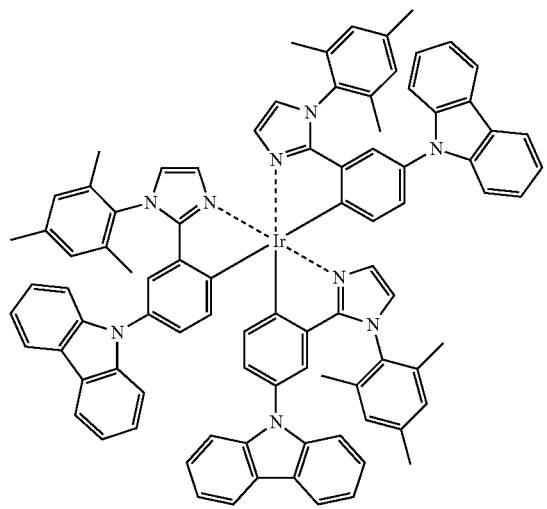
1-95
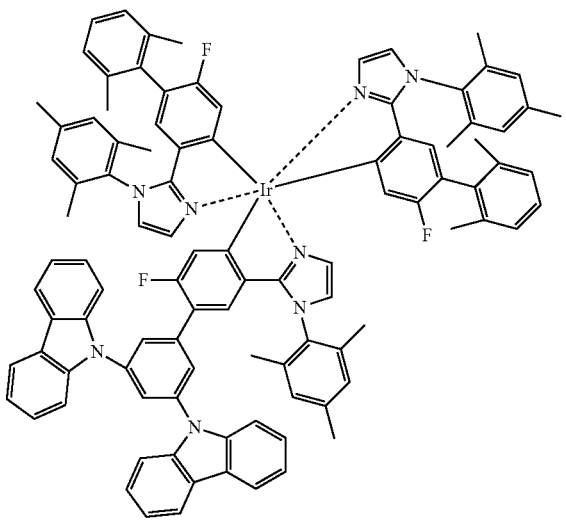
1-96
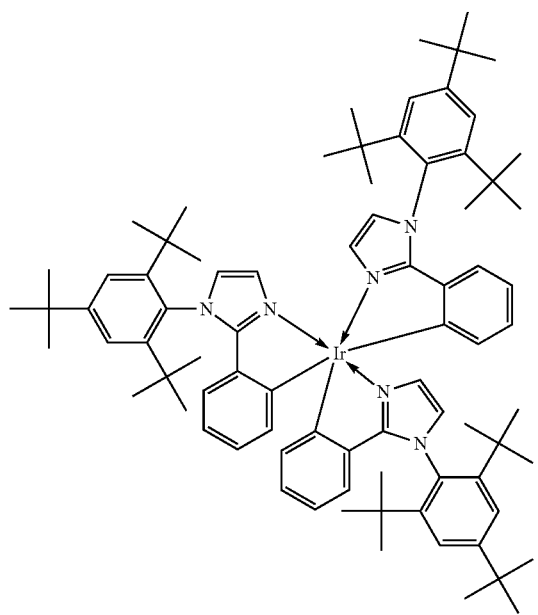
1-97
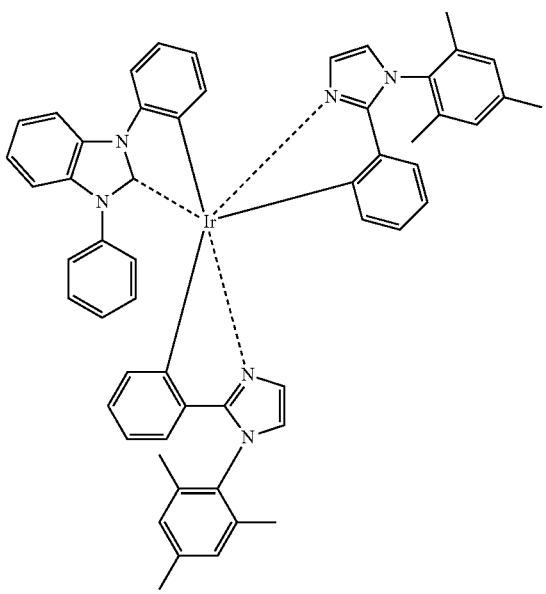

1-98
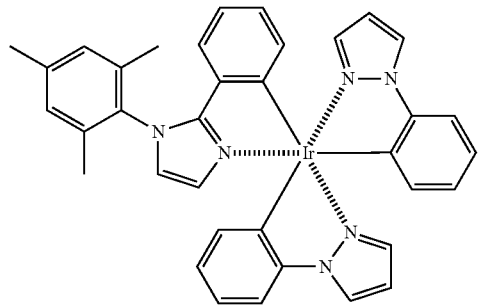
1-99
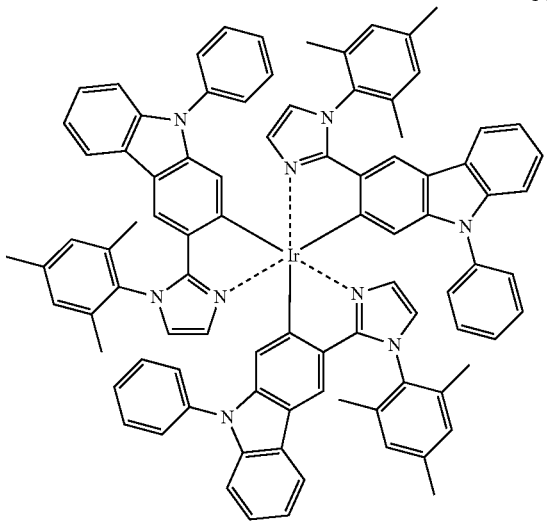
1-100
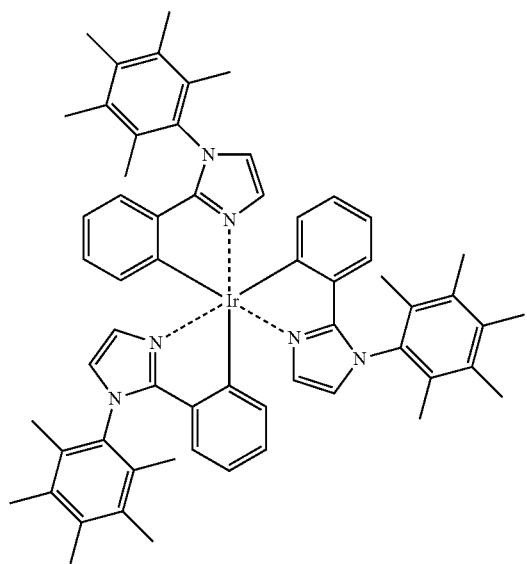
1-101
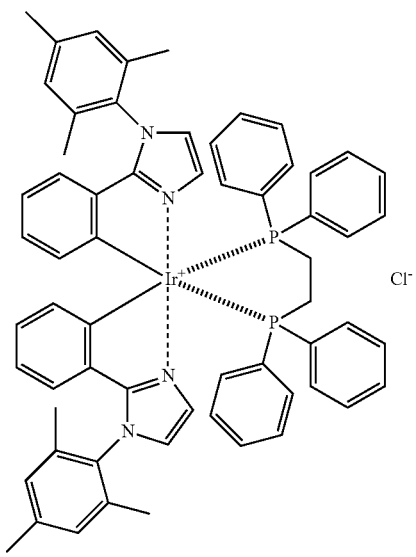

-continued
1-102
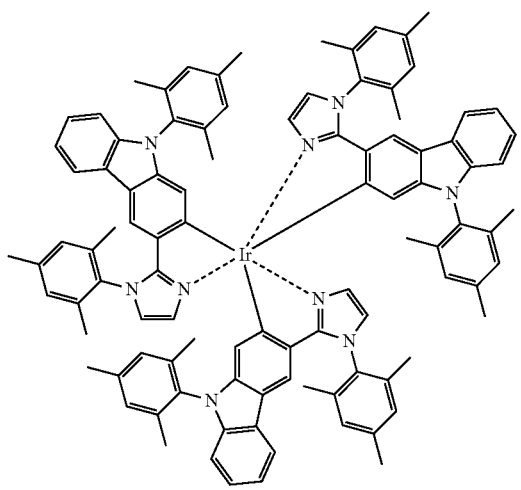
1-103
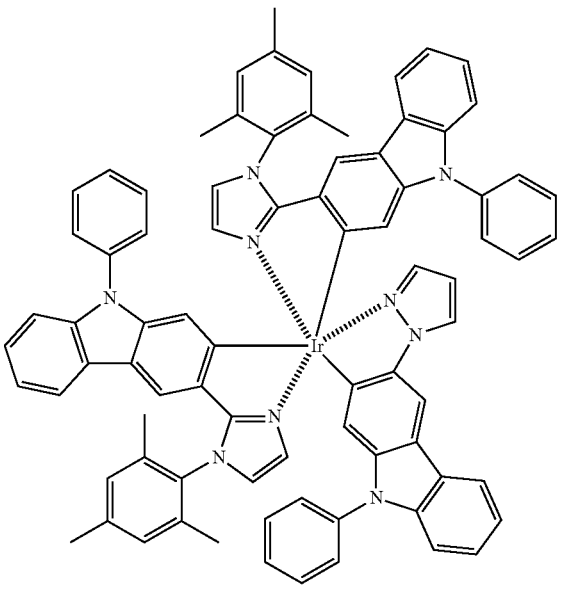
1-104
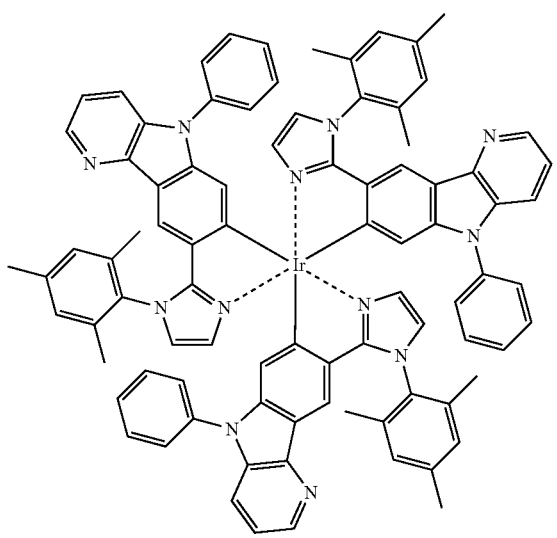
1-105
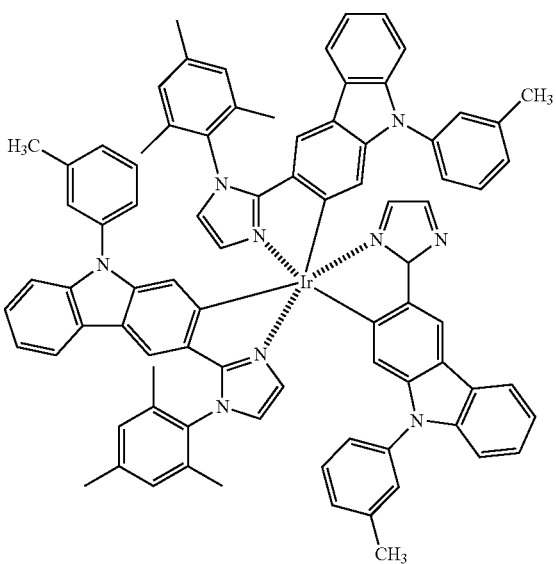

1-106

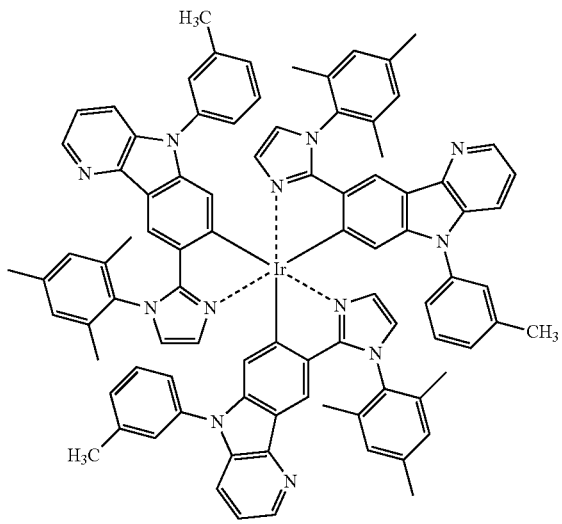

1-107

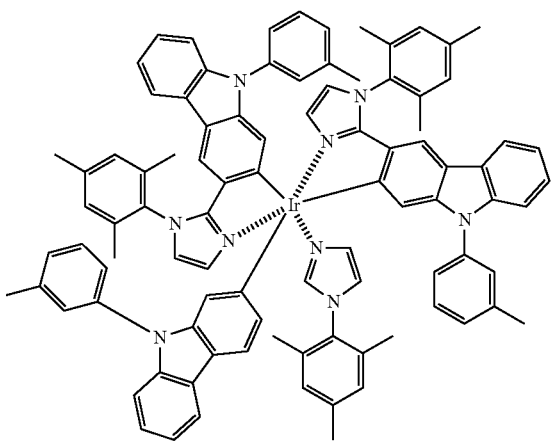

Such metal complexes can be synthesized by applying a method described in documents such as Organic Letter, vol. 3, No. 16, pp. 2579-2581 (2001), Inorganic Chemistry vol. 30, No. 8, pp. 1685-1687 (1991), J. Am. Chem. Soc., vol. 123, p. 4304 (2001), Inorganic Chemistry vol. 40, No. 7, pp. 1704-1711 (2001), Inorganic Chemistry vol. 41, No. 12, pp. 3055-3066 (2002), New Journal of Chemistry, vol. 26, p. 1171 (2002), and references described in these documents.

[Host Compounds]

Next, the host compounds (also referred to as a light-emitting host compound) incorporated in the light emitting layer will be described.

The host compound incorporated in the light emitting layer of the organic EL element of the present invention is defined as a compound which preferably exhibits a phosphorescence quantum yield of phosphorescent light emission of less than 0.1, and more preferably less than 0.01. Further, it is preferable that the mass ratio of the host compound in the light emitting layer is 20% or more of the whole compounds incorporated in the layer.

Structures of the light emitting host compounds employed in the present invention are not particularly limited. Representative examples include carbazole derivatives, triarylamine derivatives, aromatic borane derivatives, nitrogen-containing heterocyclic compounds, thiophene derivatives, furan derivatives, compounds having a basic skeleton of oligoarylene compounds, carboline derivatives, diazacarbazole derivatives (the diazacarbazole derivatives denote compounds in which at least one of the carbon atoms of the hydrocarbon ring constituting a carboline ring of carboline derivatives is replaced with a nitrogen atom).

Further, the host compound employed in the present invention may be a low molecular weight compound or a high molecular weight compound having repeating units, as well as a low molecular weight compound having a polymerizable group such as a vinyl group or an epoxy group (a vapor deposition polymerizable light emitting host).

As the host compound employed in the light emitting layer relating to the present invention, the compounds represented by Formula (a) below are preferred.

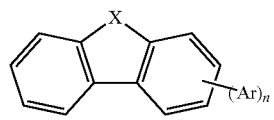

Formula (a)

In above Formula (a), X represents NR', O, S, CR'R", or SiR'R", wherein R' and R" each represents a hydrogen atom or a substituent; Ar represents an aromatic ring; and n represents an integer of 0 to 8.

In X of Formula (a), substituents represented by each of R' and R" include: an alkyl group (for example, a methyl group, an ethyl group, a propyl group, an isopropyl group, a tert-butyl group, a pentyl group, a hexyl group, an octyl group, a dodecyl group, a tridecyl group, a tetradecyl group and a pentadecyl group), a cycloalkyl group (for example, a cyclopentyl group and a cyclohexyl group), an alkenyl group (for example, a vinyl group, an allyl group, an 1-propenyl group, a 2-butenyl group, an 1,3-butadienyl group, a 2-pentenyl group, and an isopropenyl group), an alkynyl group (for example, an ethynyl group and a propargyl group), an aromatic hydrocarbon ring group (also referred to as an aromatic carbon ring group or an aryl group such as a phenyl group, a p-chlorophenyl group, a mesityl group, a tolyl group, a xylyl group, a naphthyl group, an anthryl group, an azulenyl group, an acenaphthenyl group, a fluorenyl group, a phenanthryl group, an indenyl group, a pyrenyl group, or a biphenyl group), an aromatic heterocyclic group (for example, a furyl group, a thienyl group, a pyridyl group, a pyridazinyl group, a pyrimidinyl group, a pyrazinyl group, a triazinyl group, an imidazolyl group, a pyrazolyl group, a thiazolyl group, a quinazolinyl group, a carbazolyl group, a carbolinyl group, a diazacarbazoyl group (a group in which any one of the carbon atoms constituting a carboline ring of the above carbolinyl group is replaced with a nitrogen atom), and a phthalazinyl group), a heterocyclic group (for example, a pyrrolidyl group, an imidazolidyl group, a morpholyl group, and an oxazolidyl group), an alkoxyl group (for example, a methoxy group, an ethoxy group, a propyloxy group, a pentyloxy group, a hexyloxy group, an octyloxy group and a dodecyloxy group), a cycloalkoxy group (for example, a cyclopentyloxy group and a cyclohexyloxy group), an aryloxy group (for example, a phenoxy group and a naphthyloxy group), an alkylthio group (for example, a methylthio group, an ethylthio group, a propylthio group, a pentylthio group, a hexylthio group, an octylthio group and a dodecylthio group), a cycloalkylthio group (for example, a cyclopentylthio group and a cyclohexylthio group), an arylthio group (for example, a phenylthio group and a naphthylthio group), an alkoxycarbonyl group (for example, a methyloxycarbonyl group, an ethyloxycarbonyl group, a butyloxycarbonyl group, an octyloxycarbonyl group and a dodecyloxycarbonyl group), an aryloxycarbonyl group (for example, a phenyloxycarbonyl group and a naphthyloxycarbonyl group), a sulfamoyl group (for example, an aminosulfonyl group, a methylaminosulfonyl group, a dimethylaminosulfonyl group, a butylaminosulfonyl group, a hexylaminosulfonyl group, a cyclohexylaminosulfonyl group, an octylaminosulfonyl group, a dodecylaminosulfonyl group, a phenylaminosulfonyl group, a naphthylamino sulfonyl group and a 2-pyridylaminosulfonyl group), an acyl group (for example, an acetyl group, an ethylcarbonyl group, a propylcarbonyl group, a pentylcarbonyl group, a cyclohexylcarbonyl group, an octylcarbonyl group, a 2-ethylhexylcarbonyl group, dodecylcarbonyl group, a phenyl carbonyl group, a naphthylcarbonyl group and a pyridylcarbonyl group), an acyloxy group (for example, an acetyloxy group, an ethylcarbonyloxy group, a butylcarbonyloxy group, an octylcarbonyloxy group, a dodecylcarbonyloxy group and a phenylcarbonyloxy group), an amide group (for example, a methylcarbonylamino group, an ethylcarbonylamino group, a dimethylcarbonylamino group, a propylcarbonylamino group, pentylcarbonylamino group, a cyclohexylcarbonylamino group, a 2-ethylhexylcarbonylamino group, an octylcarbonylamino group, a dodecylcarbonylamino group, a phenylcarbonylamino group and a naphthylcarbonylamino group), a carbamoyl group (for example, an aminocarbonyl group, a methylaminocarbonyl group, a dimethylaminocarbonyl group, a propylaminocarbonyl group, a pentylaminocarbonyl group, a cyclohexylaminocarbonyl group, an octylaminocarbonyl group, a 2-ethylhexylaminocarbonyl group, a dodecylaminocarbonyl group, a phenylaminocarbonyl group, a naphthylaminocarbonyl group and a 2-pyridylaminocarbonyl group), a ureido group (for example, a methylureido group, an ethylureido group, a pentylureido group, a cyclohexylureido group, an octylureido group, a dodecylureido group, a phenylureido group, a naphthylureido group and a 2-pyridylaminoureido group), a sulfinyl group (for example, a methylsulfinyl group, an ethylsulfinyl group, a butylsulfinyl group, a cyclohexylsulfinyl group, a 2-ethylhexylsulfinyl group, a dodecylsulfinyl group, a phenylsulfinyl group, a naphthylsulfinyl group and a 2-pyridylsulfinyl group), an alkylsulfonyl group (for example, a methylsulfonyl group, an ethylsulfonyl group, butylsulfonyl group, a cyclohexylsulfonyl group, a 2-ethylhexylsulfonyl group and a dodecylsulfonyl group), an arylsulfonyl group or a heteroarylsulfonyl group (for example, a phenylsulfonyl group, a naphthylsulfonyl group and a 2-pyridylsulfonyl group), an amino group (for example, an amino group, an ethylamino group, a dimethylamino group, a butylamino group, a cyclopentylamino group, a 2-ethylhexylamino group, a dodecylamino group, an anilino group, a naphthylamino group and a 2-pyridylamino group), a halogen atom (for example, a fluorine atom, a chlorine atom, and a bromine atom), a fluorinated hydrocarbon group (for example, a fluoromethyl group, a trifluoromethyl group, a pentafluoroethyl group, and a pentafluorophenyl group), a cyano group, a nitro group, a hydroxyl group, a mercapto group, a silyl group (for example, a trimethylsilyl group, a triisopropylsilyl group, a triphenylsilyl group, and a phenyldiethylsilyl group), and a phosphono group.

These substituents may further be substituted with any of the above substituents, and a plurality of these substituents may bond to each other to form a ring.

In Formula (a), preferred X is either NR' or O, and as R', an aromatic hydrocarbon group and an aromatic heterocyclic ring group are particularly preferred.

In Formula (a), the aromatic ring represented by Ar includes an aromatic hydrocarbon ring and an aromatic heterocyclic ring. Further, the above aromatic ring may be either a single ring or a condensed ring, and may have no substituent or the substituent described below.

In Formula (a), the aromatic hydrocarbon ring represented by Ar includes a benzene ring, a biphenyl ring, a naphthalene ring, an azulene ring, an anthracene ring, a phenanthrene ring, a pyrene ring, a chrysene ring, a naphthacene ring, a triphenylene ring, an o-terphenyl ring, a m-terphenyl ring, a p-terphenyl ring, an acenaphthene ring, a coronene ring, a fluorene ring, a fluoranthrene ring, a naphthacene ring, a pentacene ring, a perylene ring, a pentaphene ring, a picene ring, a pyrene ring, a pyranthrene ring and an anthranthrene ring. These rings may further have a substituent.

In Formula (a), the aromatic heterocyclic ring represented by Ar includes, for example, a furan ring, a dibenzofuran ring, a thiophene ring, an oxazole ring, a pyrrole ring, a pyridine ring, a pyridazine ring, a pyrimidine ring, a pyrazine ring, a triazine ring, a benzimidazole ring, an oxadiazole ring, a triazole ring, an imidazole ring, a pyrazole ring, a thiazole ring, an indole ring, an indazole ring, a benzothiazole ring, a benzoxazole ring, a quinoquisaline ring, a quinazoline ring, a cinnolinering, a quinoline ring, an isoquinoline ring, a phthalazine ring, a naphthyridinering, a carbazole ring, a carboline ring and a diazacarbazole ring (a ring in which one of the carbon atoms constituting a carboline ring is further substituted by a nitrogen atom). These rings may further have a substituent.

Of the above compounds, in Formula (a), as an aromatic ring represented by Ar, preferably employed are a carbazole ring, a carboline ring, a dibenzofuran ring, and a benzene ring, and particularly preferably employed are a carbazole ring, a carboline ring, and a benzene ring. Of the above compounds, a benzene ring having a substituent is preferred, and a benzene ring having a carbazolyl group is particularly preferred.

Further, in Formula (a), as aromatic rings represented by Ar, each of the condensed rings of at least three rings, as shown below, is one of the preferred embodiments. Specific examples of aromatic hydrocarbon condensed rings which are formed via condensation of at least three rings include a naphthacene ring, an anthracene ring, a tetracene ring, a pentacene ring, a hexacene ring, a phenanthrene ring, a pyrene ring, a benzopyrene ring, a benzazulene ring, a chrysene ring, a benzochrysene ring, an acenaphthene ring, an acenaphthylene ring, a triphenylene ring, a coronene ring, a benzocoronene ring, a hexabenzocoronene ring, a fluorene ring, a benzofluorene ring, a fluoranthene ring, a perylene ring, a naphthoperylene ring, a pentabenzoperylene ring, a benzoperylene ring, a pentaphene ring, a picene ring, a pyranthorene ring, a coronene ring, a naphthocoronene ring, an ovalene ring, and an anthraanthorene ring. These rings may further have a substituent.

Further, aromatic heterocyclic rings formed via condensation of at least three rings specifically include an acridine ring, a benzoquinoline ring, a carbazole ring, carboline ring, a phenazine ring, a phenanthridine ring, a phenanthroline ring, a carboline ring, a cyclazine ring, a quindoline ring, a thepenidine ring, a quinindoline ring, a triphenodithiazine ring, a triphenedioxazine ring, a phenantrazine ring, an anthrazine ring, a perymidine ring, a diazacarbazole ring (a group in which any one of the carbon atoms constituting a carboline ring is replaced with a nitrogen atom), a phenanthroline ring, a dibenzofuran ring, dibenzothiophene ring, a naphthofuran ring, a naphthothiophene ring, a benzodifuran ring, a benzothiophene ring, a naphthodifuran ring, a naphthodithiophene ring, an anthrafuran ring, an anthradifuran ring, an anthrathiophene ring, an anthradithiophene ring, a thianthorene ring, a phenoxathiin ring, a thiophanthorene ring (a naphthothiophene ring). These rings may further have a substituent.

In Formula (a), substituents, which the aromatic ring represented by Ar may have, are the same as those represented by each of R' and R".

Further, in Formula (a), n represents an integer of 0 to 8, and preferably 0 to 2. In particular, in case where X is O or S, n is preferably 1 or 2.

Specific examples of the light emitting host compounds represented by Formula (a) will be shown below. However, the present invention is not limited to them.

a-1

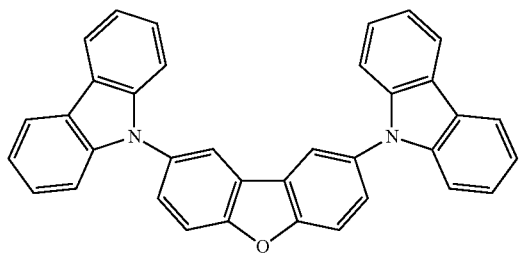

a-2

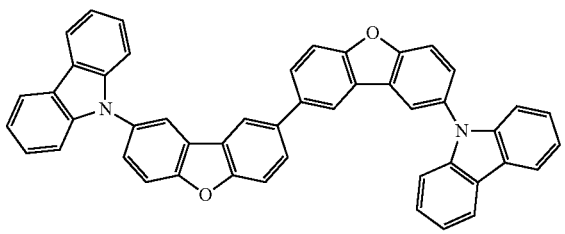

a-3

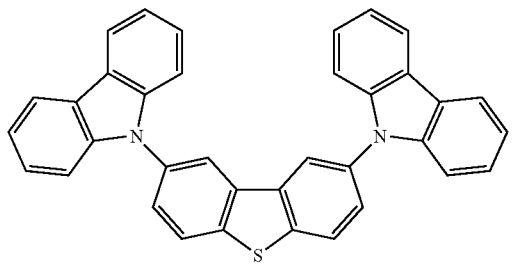

a-4

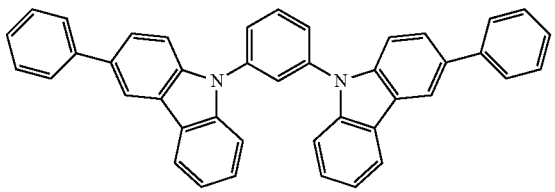

a-5

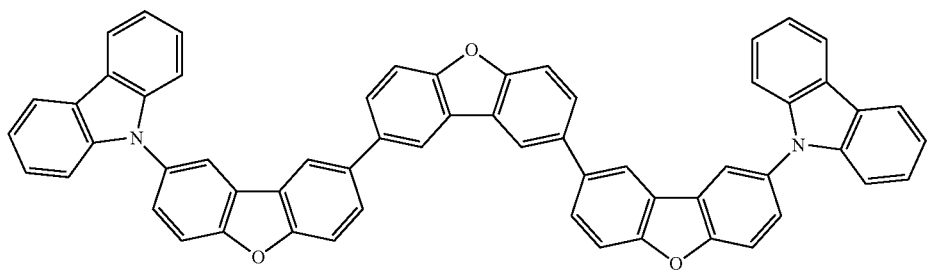

a-6

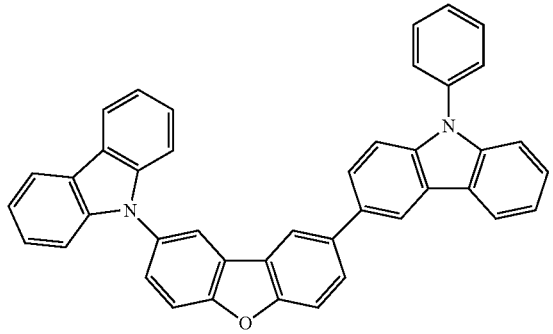

-continued
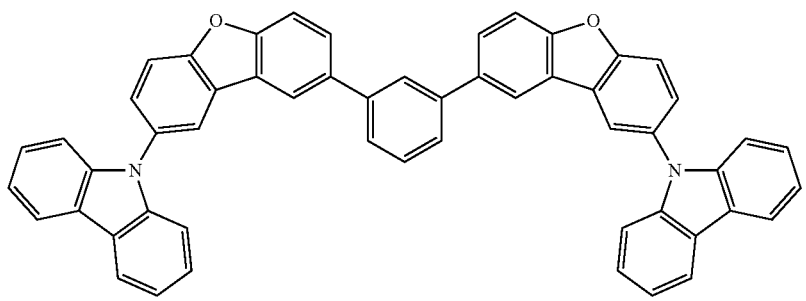
a-7
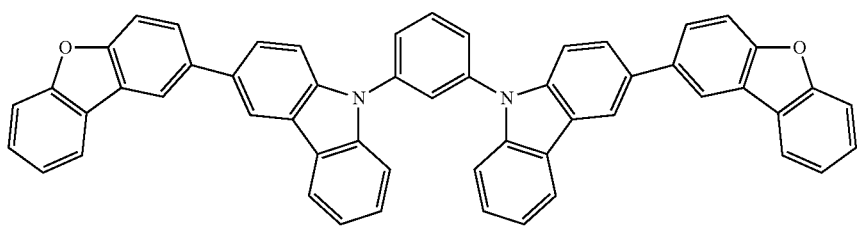
a-8
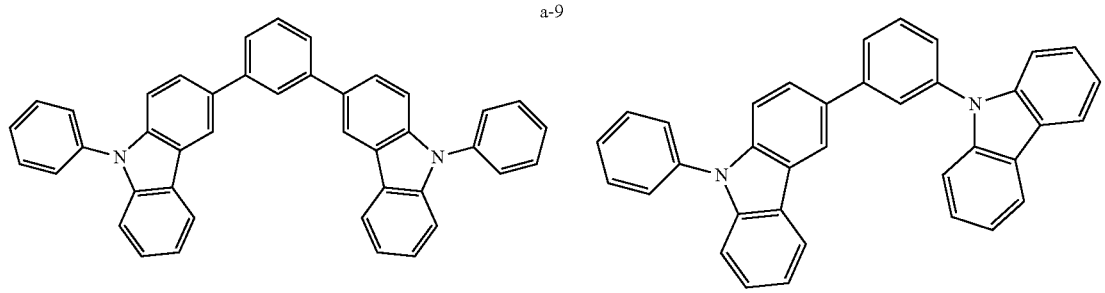
a-9
a-10
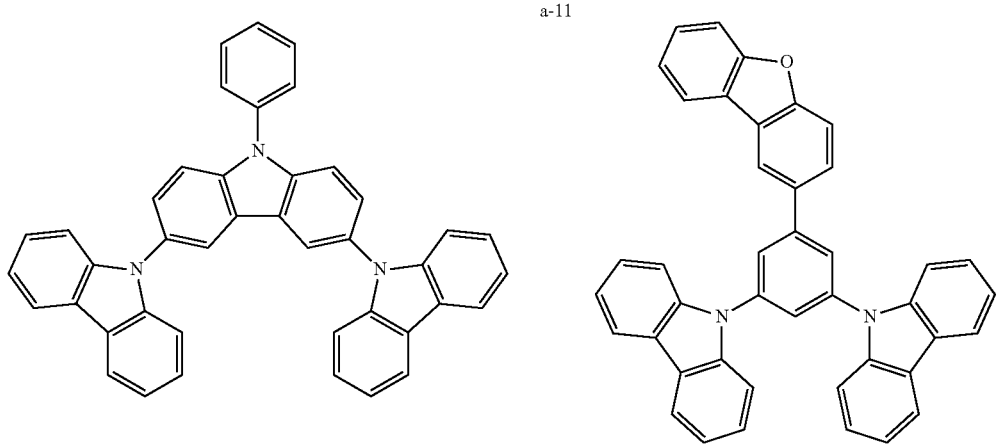
a-11
a-12 a-13
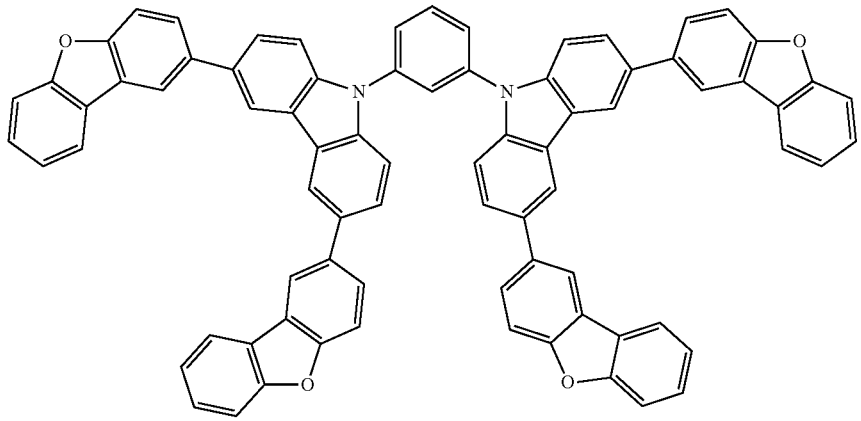
a-14
a-15
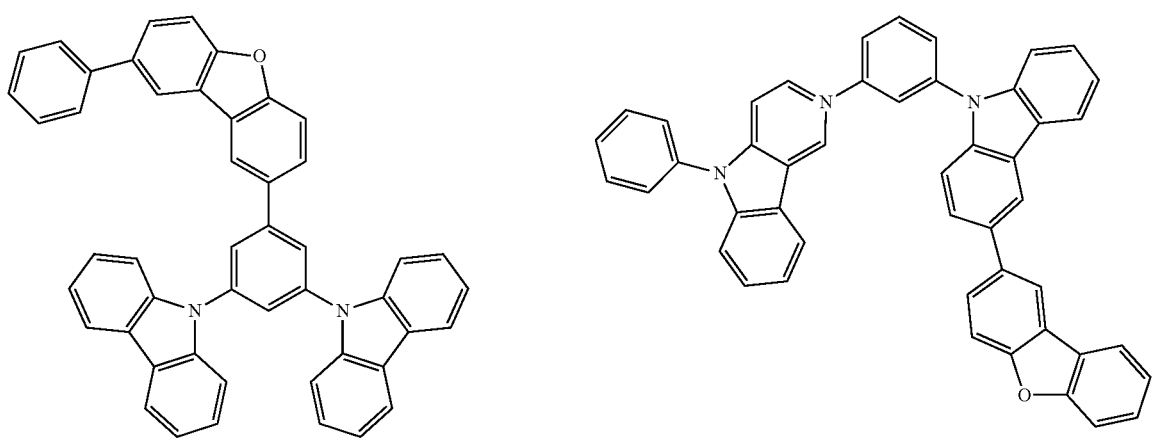
a-16
a-17
a-18
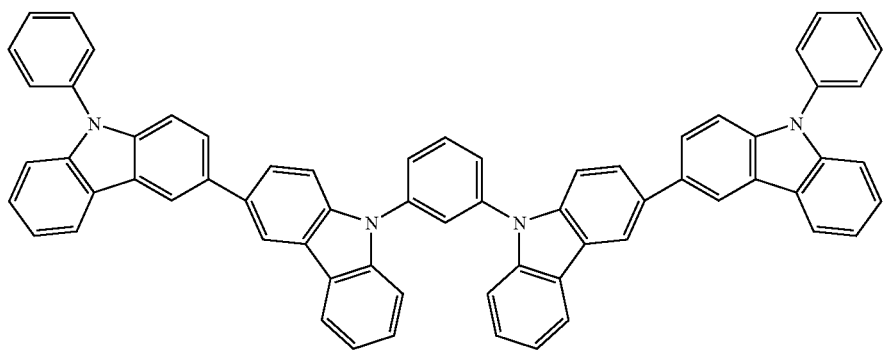
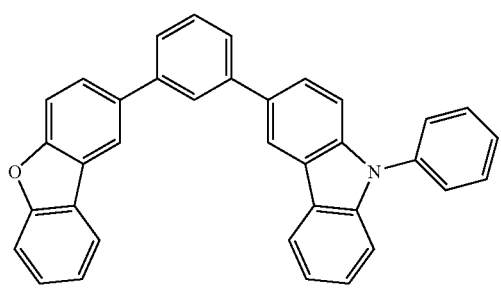
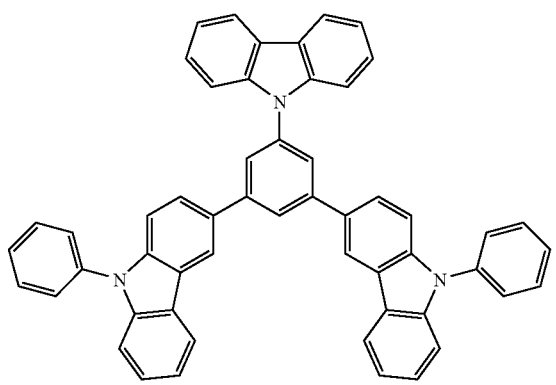

-continued
a-19
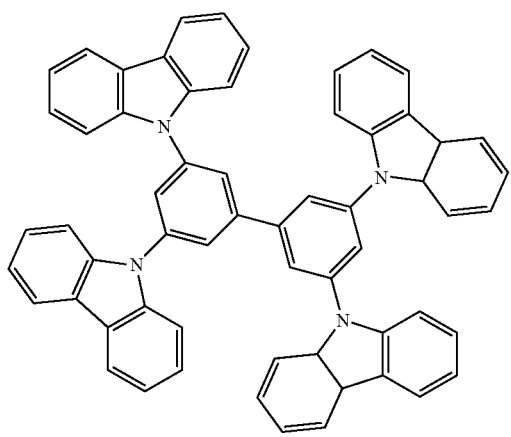
a-20
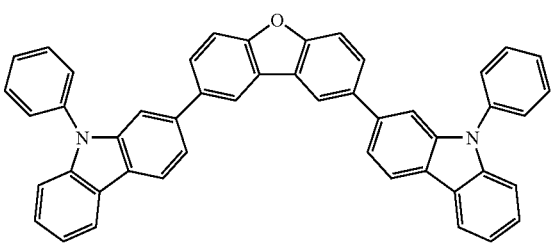
a-21
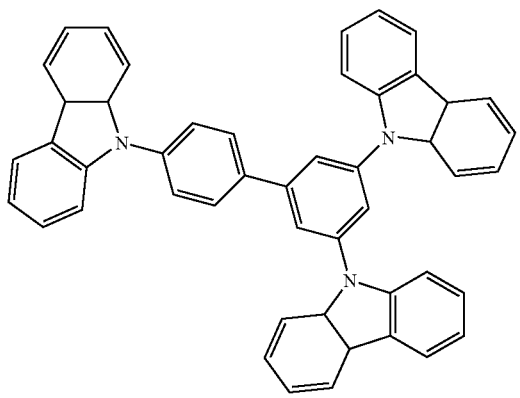
a-22
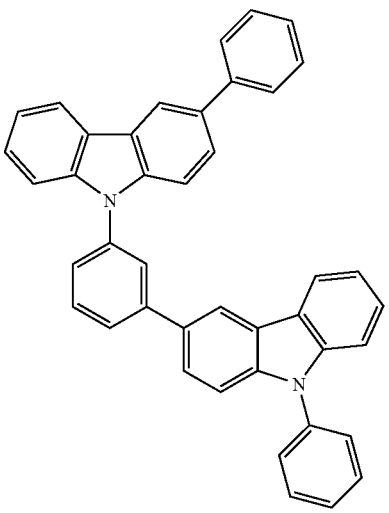
a-23
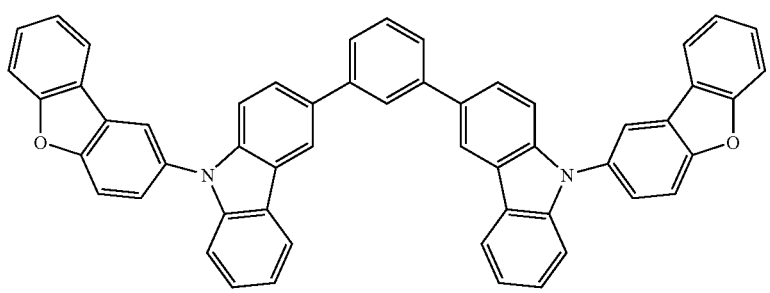

a-24
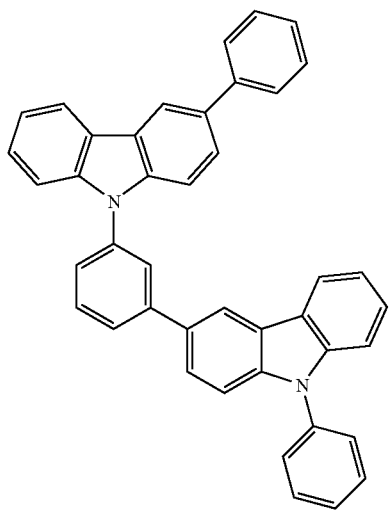
a-25
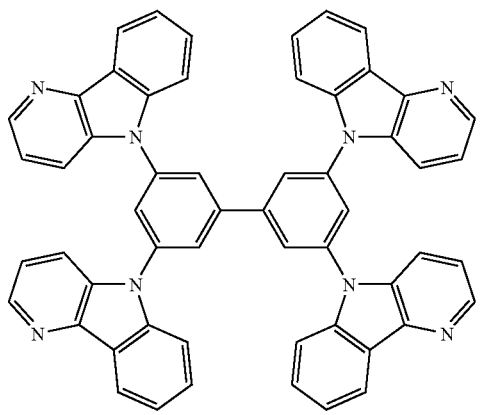
a-26
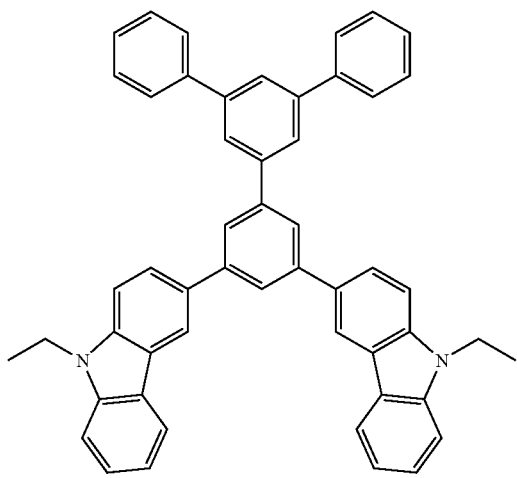
a27
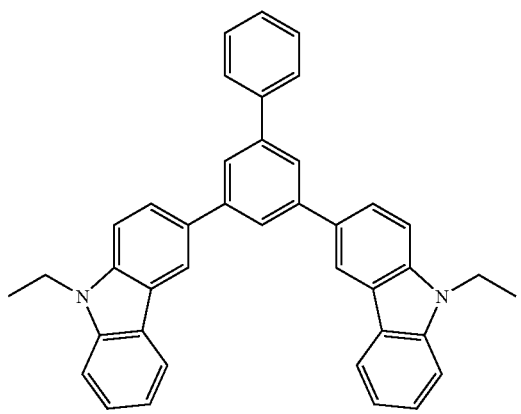
a-28
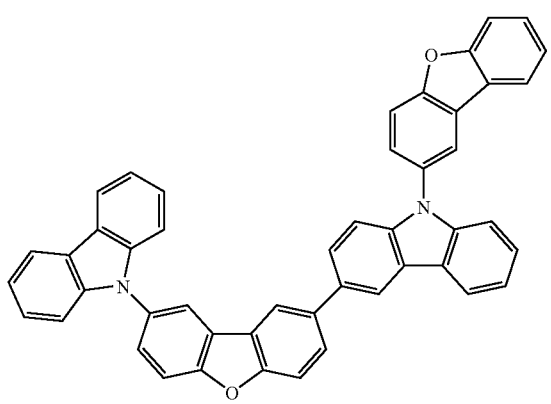
a-29
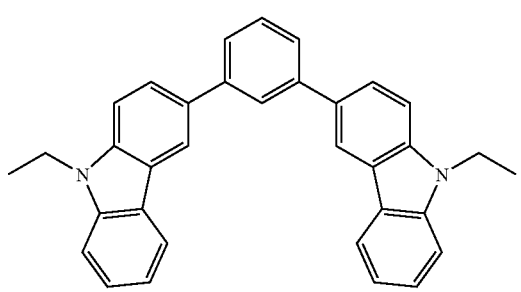

-continued
a-30
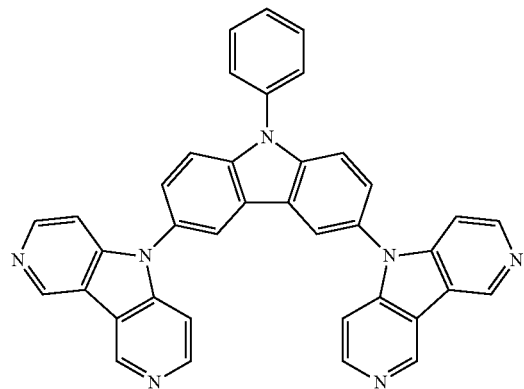
a-31
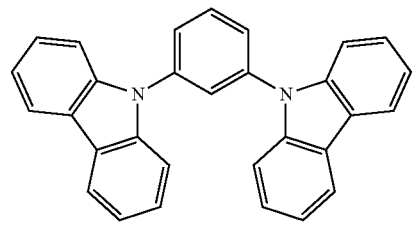
a-32
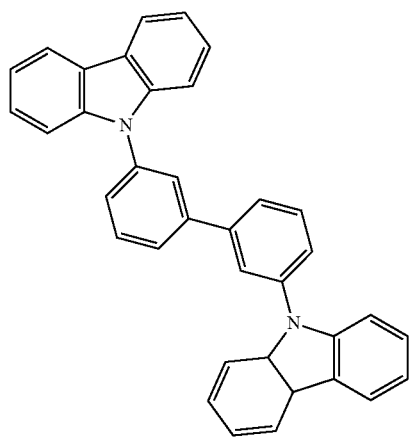
a-33
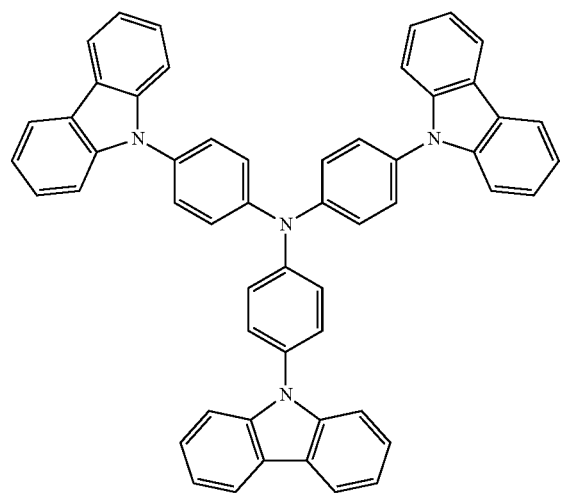
a-34
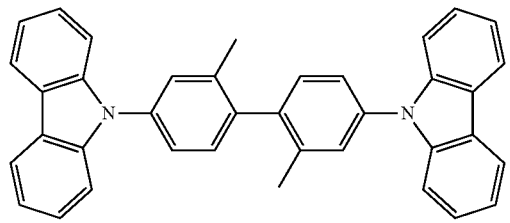
a-35
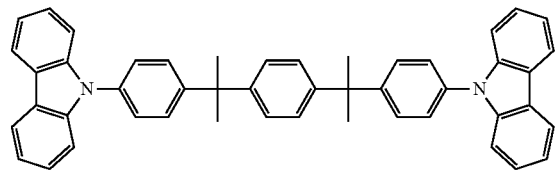
a-36
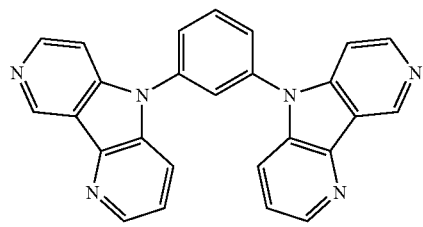
a-37
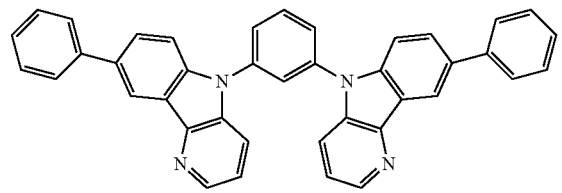

-continued
a-38
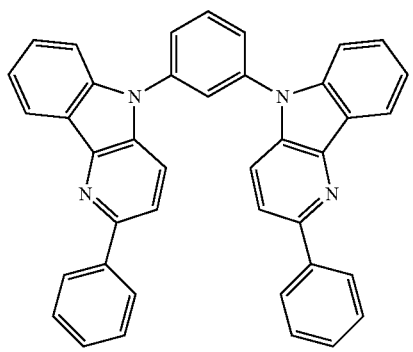
a-39
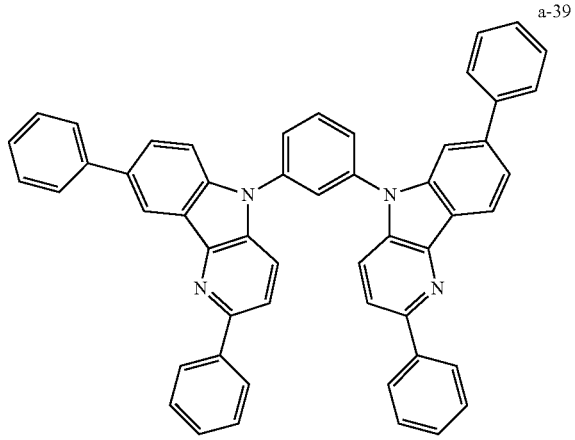
a-40
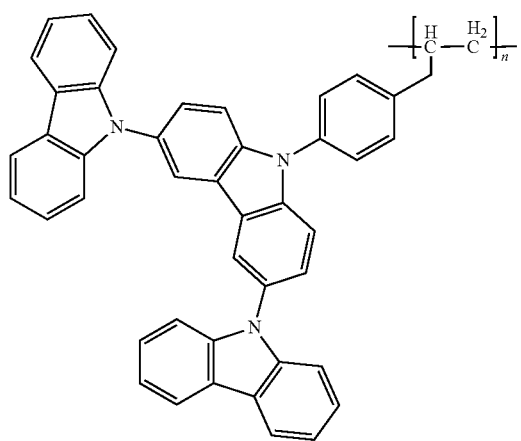
a-41
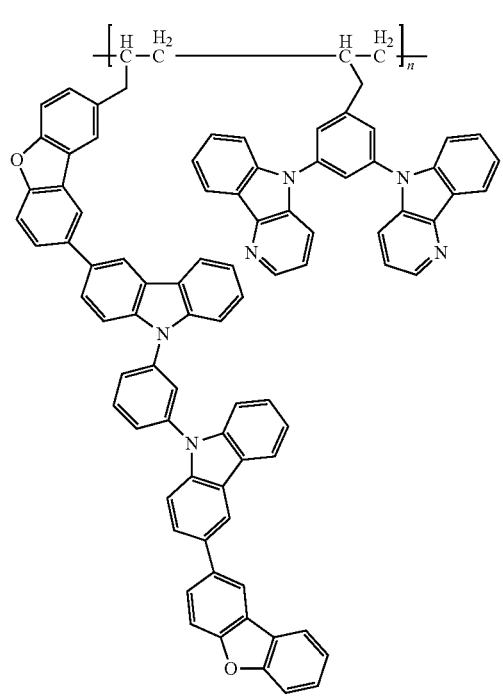

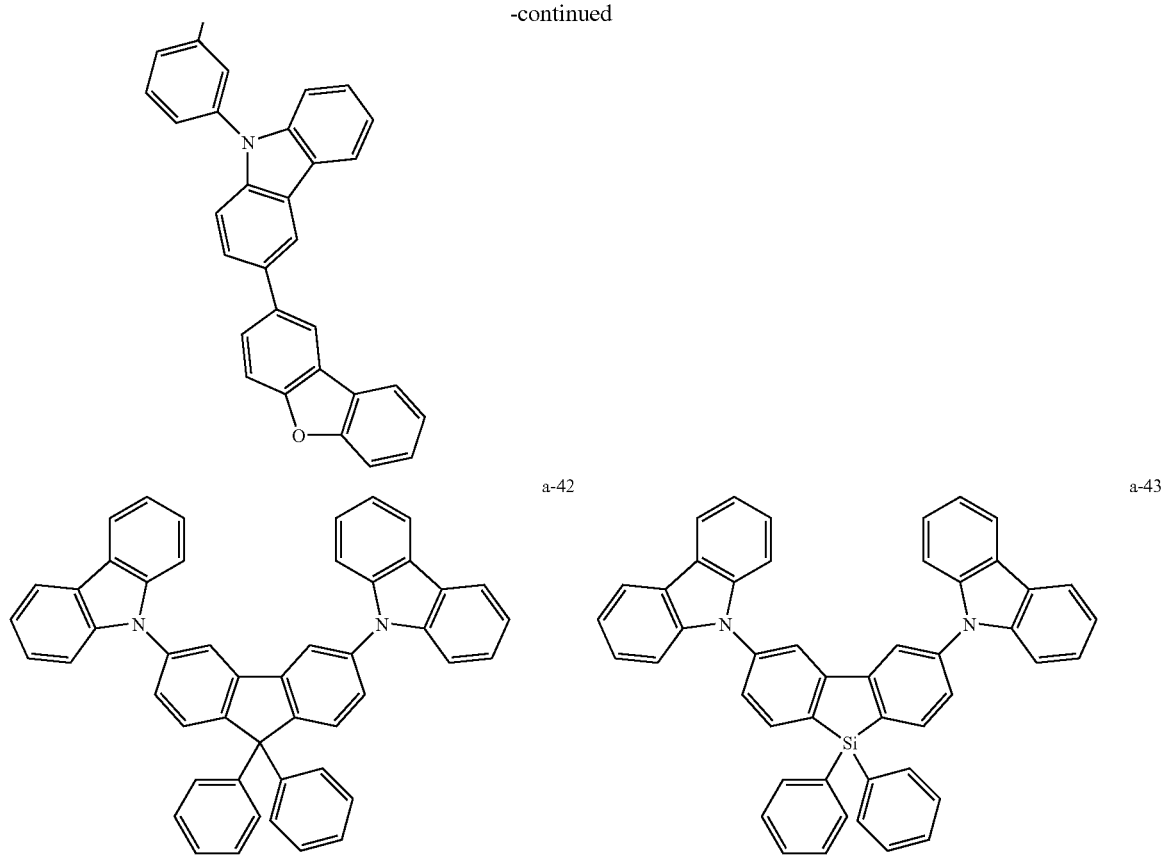

Further, specific examples of appropriate host compounds known in the art include the compounds described in the following documents; for example, JP-A Nos. 2001-257076, 2002-308855, 2001-313179, 2002-319491, 2001-357977, 2002-334786, 2002-8860, 2002-334787, 2002-15871, 2002-334788, 2002-43056, 2002-334789, 2002-75645, 2002-338579, 2002-105445, 2002-343568, 2002-141173, 2002-352957, 2002-203683, 2002-363227, 2002-231453, 2003-3165, 2002-234888, 2003-27048, 2002-255934, 2002-260861, 2002-280183, 2002-299060, 2002-302516, 2002-305083, 2002-305084, and 2002-308837.

Host compounds may be used individually, or a plurality of types thereof may be used in combination. In the present invention, it is preferable that the host compounds incorporated in all light emitting layers forming the above light emitting layer unit are the same one.

As the host compounds, it is preferable that the compounds exhibit hole transportability and electron transportability, prevent generation of emitted light having a longer wavelength, and exhibit high Tg (glass transition temperature). In the present invention, the above glass transition temperature of the host compounds is preferably 90° C. or more, and more preferably 130° C. or more in view of realizing longer driving lifetime and excellent durability.

Glass transition point (Tg), as described herein, is the value, which is determined based on the method specified in JIS K 7121, employing DSC (Differential Scanning calorimeter).

Further, it is preferable that the lowest excited triplet energy ($T_1$) of the host compound incorporated in the above light emitting layer is 2.7 eV or more since the compound exhibits higher light emission efficiency. The lowest excited triplet energy, as described in the present invention, refers to the peak energy of the light emission band corresponding to the transition between the lowest vibrational bands of the phosphorescence light emission spectra of a host compound dissolved in a solvent, and which spectra is observed at liquid nitrogen temperature.

In the organic EL element of the present invention, since the host materials play a role of carrier transportation, materials exhibiting carrier transporting ability are preferred. Carrier mobility is employed as a physical characteristic to represent the carrier transporting ability. It is commonly noted that the carrier mobility of organic materials depends on electric field strength. Since materials having high dependency on the electric field strength tend to lose the balance between injection and transportation of holes and electrons, as the host materials, it is preferable to employ materials whose mobility exhibits minimal dependence on the electric field strength.

<<Interlayer>>

In the organic EL element of the present invention, a non-light emissive interlayer (also referred to as a non-dope region) may be provided between the light emitting layers.

The thickness of the non-light emissive interlayer is preferably in the range of 1 to 50 nm, and more preferably in the range of 3 to 10 nm, in view of retarding the mutual interaction such as an energy transfer between the adjacent light emitting layers and posing no significant burden to electric current and voltage characteristics of organic EL elements.

The material employed in the above non-light emitting interlayer may be the same as the host compound used in the light emitting layer or different from the compound. However, it is preferable that the host compound is the same as that of used in at least one of two adjacent light emitting layers.

The non-light emitting interlayer may incorporate compounds which are common to those (for example, host compounds) of each of the light emitting layers. By incorporating each of the common host materials (as used herein, "employing common host materials" refers to the case in which physicochemical characteristics such as phosphorescence emitting energy or the glass transition point are the same, or the case in which the molecular structure of the host compound is the same), the injection barrier between the light emitting layer and the non-light emitting layer is lowered, whereby it is possible to realize effects in which, even though the electric voltage (and electric current) changes, it is easy to maintain a balance between hole injection and electron injection.

Further, by employing, in the non-dope light emitting layer, host materials exhibiting the same physical characteristics or the same molecular structure as those of the host compounds incorporated in each of the light emitting layers, it is also possible to overcome troublesome of the element preparation which is a major drawback during preparation of conventional organic EL elements.

Still further, in order to optimally regulate the injection balance between hole and electron, listed is a preferred embodiment in which the non-light emitting interlayer also functions as the blocking layer described below, namely as a hole blocking layer and an electron blocking layer.

<<Injection Layers: Electron Injection Layer and Hole Injection Layer>>

As needed, it is possible to provide the injection layer, which may be provided between the anode and the light emitting layer or the hole transporting layer, and between the cathode and the light emitting layer or the electron transporting layer.

The injection layer refers to the layer which is provided between the electrode and the organic layer to lower the driving voltage and enhance light emission luminance, and is detailed, for example, in Chapter 2 "Denkyoku Zairyo (Electrode Materials)" (pages 123-166), Second Part "Yuki EL Soshi to Sono Kogyoka Saizensen (Organic EL Elements and Forefront of Their Industrialization)" (published by NTS Inc., Nov. 30, 1998), in which the injection layers include a hole injection layer (an anode buffer layer) and an electron injection layer (a cathode buffer layer).

The anode buffer layer (the hole injection layer) is also detailed in JP-A Nos. 9-45479, 9-260062, and 8-288069. Specific examples thereof include a phthalocyanine buffer layer incorporating copper phthalocyanine as a representative compound, an oxide buffer layer incorporating vanadium oxide as a representative compound, an amorphous carbon buffer layer, and a polymer buffer layer employing electrically conductive polymers such as polyaniline (emeraldine) or polythiophene. Further, it is also preferable to employ the materials described in JP-A No. 2003-519432.

The cathode buffer layer (the electron injection layer) is detailed in JP-A Nos. 6-325871, 9-17574, and 10-74586. Specific examples thereof include a buffer layer of a metal represented by strontium and aluminum, a buffer layer of an alkaline metal compound represented by lithium fluoride, a buffer layer of an alkaline earth metal compound represented by magnesium fluoride, and a buffer layer of an oxide represented by aluminum oxide.

The above buffer layers (injection layers) are preferably thin films, and the film thickness is preferably in the range of 0.1 nm to 5 μm, depending on the components used.

<<Blocking Layers: Hole Blocking Layer and Electron Blocking Layer>>

Blocking layers are provided as needed, other than the basic constituting layer composed of thin organic compound layers. Examples thereof include hole blocking layers described, for example, in JP-A Nos. 11-204258 and 11-204359, as well as on page 237 of "Yuki EL Soshi to Sono Kogyoka Saizensen (Organic EL Elements and Forefront of Their Industrialization)" (published by NTS Inc., Nov. 30, 1998).

The hole blocking layer is composed of hole blocking materials which exhibit, in a broad sense, the function of an electron transporting layer and also exhibit minimal hole transportability while exhibiting the function of electron transportation, and consequently, makes it possible to enhance recombination probability of electrons and holes by transporting electrons and simultaneously blocking holes. Further, it is possible to employ, as needed, the electron transporting layer configuration, described below, as the hole blocking layer.

It is preferable that the hole blocking layer provided in the organic EL element of the present invention is arranged adjacent to the light emitting layer.

On the other hand, the electron blocking layer is composed of materials which exhibit, in a broad sense, the function of the hole transporting layer and exhibit minimal electron transportability while exhibiting the function of transporting holes, and consequently, makes it possible to enhance recombination probability of electrons and holes while transporting electrons and simultaneously blocking electrons. Further, it is possible to employ, as needed, the hole transporting layer configuration, described below, as the electron blocking layer.

The thickness of the hole blocking layer or the electron transporting layer relating to the present invention is preferably 3 to 100 nm, and more preferably 5 to 30 nm.

<<Hole Transporting Layer>>

The hole transporting layer is composed of hole transporting materials exhibiting the function of transporting holes, and, in a broad sense, includes a hole injection layer and an electron blocking layer. The hole transporting layer may be composed of a single layer or a plurality of layers.

Hole transporting materials are those which exhibit either the injection or transportation of holes, or the blocking of electrons, and may be either organic or inorganic compounds. Examples thereof include triazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, oxazole derivatives, styrylanthracene derivatives, fluorenone derivatives, hydrazone derivatives, stilbene derivatives, silazane derivatives, and aniline based copolymers, as well as electrically conductive high molecular weight oligomers, especially thiophene oligomers.

It is possible to employ, as hole transporting materials, the above materials. In addition, it is preferable to employ porphyrin compounds, aromatic tertiary amine compounds, and styrylamine compounds. Of these, it is particularly preferred to employ the aromatic tertiary amine compounds.

Representative examples of the aromatic tertiary amine compounds and styrylamine compounds include N,N,N',N'-tetraphenyl-4,4'-diaminophenyl, N,N'-diphenyl-N,N'-bis(3-methylphenyl)-[1,1'-biphenyl]-4,4'-diamine (TPD), 2,2-bis(4-di-p-tolylaminophenyl)propane, 1,1-bis(4-di-p-tolylaminophenyl)cyclohexane, N,N,N',N'-tetra-p-tolyl-4,4'-diaminobiphenyl, 1,1-bis(4-di-p-tolylaminophenyl)-4-phenylcyclohexane, bis(4-dimethylamino-2-methylphenyl)phenylmethane, bis(4-di-p-tolylaminophenyl)

phenylmethane, N,N'-diphenyl-N,N'-di(4-methoxyphenyl)-4,4'-diaminobiphenyl, N,N,N',N'-tetraphenyl-4,4'-diaminodiphenyl ether, 4,4'-bis(diphenylamino)quadriphenyl, N,N,N-tri(p-tolyl)amine, 4-(di-p-tolylamino)-4'-[4-(di-p-tolylamino)styryl]stilbene, 4-N,N-diphenylamino-(2-diphenylvinyl)benzene, 3-methoxy-4'-N,N-diphenylaminostilbene, and N-phenylcarbazole. Further listed are compounds having two condensed aromatic rings in the molecule such as 4,4'-bis[N-(1-naphthyl)-N-phenylamino]biphenyl (NPD), described in U.S. Pat. Nos. 5,061,569, and 4,4',4"-tris[N-(3-methylphenyl)-N-phenylamino]triphenylamine (MTDATA) in which three triphenylamine units are linked in a starburst type, described in JP-A No. 4-308688.

In addition, it is possible to employ polymer materials in which any of the above materials are introduced in the polymer chains or employed as a main chain. Further, inorganic compounds such as p-type Si or p-type SIC can be employed as a hole injection material or a hole transporting material.

It is further possible to employ hole transporting materials, which exhibit so-called p-type semiconductor properties, described in JP-A Nos. 4-297076, 2000-196140, and 2001-102175; J. Appl. Phys., 95, 5773 (2004); JP-A No. 11-251067; a literature written by J. Huang et al. (Applied Physics Letters 80 (2002), P. 139); and JP-A No. 2003-519432. In the present invention, it is preferable to employ these materials, since light emitting elements exhibiting a higher efficiency can be prepared.

The hole transporting layer can be formed by making the above hole transporting materials into a thin film by a known method such as a vacuum vapor deposition method, a spin coating method, a casting method, a printing method including an ink-jet method, or an LB method. The thickness of the hole transporting layer is not particularly limited, but is usually about 5 nm to about 5 μm, preferably 5 to 200 nm. The above hole transporting layer may have a single layer structure composed of at least one type of the above materials.

<<Electron Transporting Layer>>

The electron transporting layer is composed of materials which exhibit a function to transport electrons, and includes, in a broad sense, an electron ejection layer and a hole blocking layer. The electron transporting layer may be composed of a single layer or a plurality of layers.

Heretofore, in the case of a single electron transporting layer or a plurality of them, any electron transport materials (which also work as hole blocking materials), which are employed in the electron transporting layer adjacent to the cathode electrode side with respect to the light emitting layer, have been applicable as long as they exhibit a function to transfer electrons injected from the cathode to the light emitting layer. As such materials, any of those selected from the compounds known in the art can be employed. Examples thereof include nitro-substituted fluorene derivatives, diphenylquinone derivatives, thiopyran dioxide derivatives, carbodiimide, fluorenylydenemethane derivatives, anthraquinodimethane and anthrone derivatives, as well as oxadiazole derivatives. Further, thiadiazole derivatives in which the oxygen atom of the oxadiazole ring in the above oxadiazole derivatives was replaced by a sulfur atom, and quinoxaline derivatives having a quinoxaline ring known as an electron attractive group may also be employed as electron transporting materials. In addition, it is possible to employ polymer materials in which any of the above materials are introduced in the polymer chains or employed as a main chain.

Further, as the electron transporting materials there can be employed metal complexes of 8-quinolinol derivatives such as tris(8-quinolinol)aluminum (Alq), tris(5,7-dichloro-8-quinolinol)aluminum, tris(5,7-dibromo-8-quinilinol)aluminum, tris(2-methyl-8-quinolinol)aluminum, tris(5-methyl-8-quinilinol)aluminum, or bis(8-quinolinol)zinc (Znq), or metal complexes in which the central metal atom of these metal complexes is replaced with In, Mg, Cu, Ca, Sn, Ga, or Pb. Other than these, as the electron transporting materials, metal-free or metal phthalocyanines, or compounds in which the end of the above phthalocyanine is substituted with an alkyl group or a sulfonic acid group may be preferably employed. Further, distyrylpyrazine derivatives may also be employed as electron transporting materials. Still further, inorganic semiconductors such as n-type Si or n-type SiC may be employed as electron transporting materials in the same manner that they may be employed as the hole injection layer or the hole transporting layer.

The electron transporting layer can be formed by making the above electron transporting materials into a thin film by a known method such as a vacuum vapor deposition method, a spin coating method, a casting method, a printing method including an ink-jet method, or an LB method. The thickness of the electron transporting layer is not particularly limited, but is usually about 5 nm to about 5 μm, preferably 5 to 200 nm. The above electron transporting layer may have a single layer structure composed of at least one type of the above materials.

Further, electron transporting materials which are thought to exhibit properties of n-type semiconductors doped with impurities may also be employed. Examples thereof include those described in JP-A Nos. 4-297076, 10-270172, 2000-196140, and 2001-102175, as well as J. Appl. Phys., 95, 5773 (2004).

In the present invention, it is preferable to employ such electron transporting materials which are thought to exhibit properties of n-type semiconductors, since it is thereby possible to prepare an element which consumes less power.

<<Support Base>>

The support base (hereinafter also referred to as a substrate, a base, a base material, or a support) applied to the organic EL element of the present invention is not particularly limited to types thereof such as glass and plastic, and may further be transparent or opaque. In case where light is taken out from the support base side, the support base is preferably transparent. The transparent support base preferably includes glass, quartz, and a transparent resin film. The particularly preferred support base is a resin film capable of resulting in flexibility of the organic EL elements.

Examples of materials of such a resin film include polyester such as polyethylene terephthalate (PET), or polyethylene naphthalate (PEN); cellulose esters or derivatives thereof such as polyethylene, polypropylene, cellophane, cellulose diacetate, cellulose triacetate, cellulose acetate butyrate, cellulose acetate propionate (CAP), cellulose acetate phthalate (TAC), or cellulose nitrate; polyvinylidene chloride, polyvinyl alcohol, polyethylene vinyl alcohol, syndiotactic polystyrene, polycarbonate, norbornene resins, polymethylpentane, polyether ketone, polyimide, polyether sulfone (PES) polyphenylene sulfide, polysulfones, polyetherimide, polyetherketoneimide, polyamide, fluororesins, nylon, polymethyl methacrylate, acryl or polyacrylates, and cycloolefin based resins such as ARTON (a registered trade, produced by JSP. Co.) or APL (a registered trade name, produced by Mitsui Chemical Co., Ltd.).

On the surface of the resin film, a coating of inorganic or organic compounds or a hybrid coating of both of them may be formed. The above coating is preferably a barrier film of a water vapor permeability of 0.01 g/(m$^2$·24 h) or less (at 25±0.5° C. and relative humidity 90±2%), which is determined based on the method of JIS K 7129-1992. Further, the above coating is preferably a high barrier film of an oxygen permeability of $10^{-3}$ ml/(m$^2$·24 h·MPa) or less determined based on the method of JIS K 7126-1987 and a water vapor permeability of $1 \times 10^{-5}$ g/(m$^2$·24 h).

As a material to form the barrier film, any materials having a function to retard the penetration of substances such as moisture or oxygen which degrade elements can be used. Usable examples thereof include silicon oxide, silicon dioxide, and silicon nitride. Further, in order to decrease brittleness of the aforesaid film, it is preferable to form a laminated layer structure composed of the above inorganic layer and a layer composed of organic materials. The lamination order of the inorganic and organic layers is not particularly limited, but it is preferable that both are alternately laminated several times.

Methods of forming the barrier film are not particularly limited, and it is possible to employ, for example, a vacuum vapor deposition method, a sputtering method, a reactive sputtering method, a molecular beam epitaxial method, a cluster ion beam method, an ion plating method, a plasma polymerization method, an atmospheric pressure plasma polymerization method, a plasma CVD method, a laser CVD method, a thermal CVD method, and a coating method. Of these, the atmospheric pressure plasma polymerization method, as described in JP-A No. 2004-68143, is particularly preferred.

The opaque support bases include, for example, metal plates or films composed of aluminum or stainless steel, opaque resin bases, and bases composed of ceramic materials.

<<Sealing>>

As a sealing means employed to seal the organic EL element of the present invention, a method can be cited, for example, in which a sealing member is adhered to the electrodes and a support base employing adhesives.

As the sealing member, any member which is arranged so as to cover the display area of the organic EL element can be used, and the member may be either in the form of an intaglio plate or a flat plate. Further, transparency and electric insulation properties are not particularly limited.

Specifically included are a glass plate, a polymer plate/film, and a metal plate/film. The glass plate may include, in particular, soda-lime glass, barium and strontium containing glass, lead glass, aluminosilicic acid glass, borosilicic acid glass, barium borosilicic acid glass, and quartz. Further, the polymer plate may include those composed of polycarbonate, acryl, polyethylene terephthalate, polyether sulfide, and polysulfone. The metal plate may include those composed of at least one metal or an alloy selected from the group consisting of stainless steel, iron, copper, aluminum, magnesium, nickel, zinc, chromium, titanium, molybdenum, silicon, germanium and tantalum.

In the present invention, the polymer or metal film can be preferably used, since it can make an element into a thinner film. Furthermore, it is preferable that the polymer film exhibits an oxygen permeability of $1 \times 10^{-3}$ ml/(m$^2$·24 h·MPa) or less, which is determined by the method based on JIS K 7126-1987, and a water vapor permeability of $1 \times 10^{-3}$ g/(m$^2$·24 h) or less (at 25±0.5° C. and relative humidity 90±2%), which is determined by the method based on JIS K 7129-1992.

In order to process the sealing member into a form of an intaglio, processes such as sand blasting and chemical etching are used. Specific adhesives include photocurable and thermocurable type adhesives having a reactive vinyl group of acrylic acid based oligomers and methacrylic acid based oligomers, and moisture curable type adhesives such as 2-cyanoacrylic acid ester. Further, there can be included are a thermal and chemical curing type (a two-liquid mixed type) adhesives such as epoxy based adhesives. Still further, there can be included hot-melt type polyamide, polyester, and polyolefin. Still further, there can be included cationically curable type ultraviolet ray curable type epoxy resin adhesives.

Since organic EL elements are occasionally degraded due to a thermal treatment, preferred are those which are adhesion-curable from room temperature to 80° C. Further, desiccants may be dispersed into the above adhesives. Application of adhesives onto the sealing portion may be achieved by a commercial dispenser or by printing in the same manner as screen printing.

Further, outside of an electrode, which sandwiches an organic layer and is on the opposite side to a support base, inorganic and/or organic material layers are formed in such a configuration that the aforesaid electrode and organic layer are covered in the form of contact with the support base, whereby the above inorganic and/or organic material layers are preferably employed as the sealing coating. In this case, as a material to form the aforesaid coating, any materials can be used, if they have a function to retard the penetration of substances such as moisture or oxygen which degrade elements. Usable examples thereof include silicon oxide, silicon dioxide, and silicon nitride. Further, in order to decrease brittleness of the aforesaid coating, it is preferable to form a laminated layer structure composed of the above inorganic layer and a layer composed of organic materials. Methods for forming these coatings are not particularly limited, and it is possible to employ, for example, a vacuum vapor deposition method, a sputtering method, a reactive sputtering method, a molecular beam epitaxial method, a cluster ion beam method, an ion plating method, a plasma polymerization method, an atmospheric pressure polymerization method, a plasma CVD method, a laser CVD method, a thermal CVD method, or a coating method.

It is preferable that, as a gas or liquid phase, inert gases such as nitrogen and argon, or an inert liquid such as fluorinated hydrocarbon and silicone oil are injected into the space between the sealing member and the display area of the organic EL element. Further, the above space can be made into vacuum. Still further, the interior can be enclosed with hygroscopic compounds.

Examples of hygroscopic compounds include metal oxides (for example, sodium oxide, potassium oxide, calcium oxide, barium oxide, magnesium oxide, or aluminum oxide), sulfates (for example, sodium sulfate, calcium sulfate, magnesium sulfate, or cobalt sulfate), metal halides (for example, calcium chloride, magnesium chloride, cesium fluoride, tantalum fluoride, cerium bromide, magnesium bromide, barium iodide, or magnesium iodide), and perchlorates (for example, barium perchlorate or magnesium perchlorate). Of sulfates, metal halides, and perchlorates, anhydrous salts are suitably employed.

<<Protective Film and Protective Plate>>

In order to enhance mechanical strength of the element, a protective film or a protective plate may be provided on the outside of the above sealing coating or the above sealing film, which sandwiches an organic layer and is on the opposite side to a support base. Specifically, when sealing is achieved by the above sealing coating, the mechanical strength of the coating is not always sufficient, therefore it is preferable to provide the above protective film or protective plate. The usable materials for the above include a glass plate, a polymer plate/film, and a metal plate/film, which are the same as those employed for the above sealing. In view of making it into a light weight and a thin film, it is preferable to employ a polymer film.

<<Anode>>

As an anode in the organic EL element, preferably employed are those which employ, as electrode materials, metals, alloys, electrically conductive compounds, and mixtures thereof, which exhibit a relatively high work function (4 eV or more). Specific examples of such electrode materials include metals such as Au, and electrically conductive transparent materials such as CuI, indium tin oxide (ITO), $SnO_2$, or ZnO.

Further, materials such as IDIXO ($In_2O_3$—ZnO), which are capable of preparing an amorphous, transparent, and electrically conductive film, may be employed. The anode may be formed in such a manner that a thin film of these electrode materials is formed via methods such as vapor deposition or sputtering, and the desired shaped pattern is formed via a photolithographic method, or alternatively, in case where pattern accuracy is not necessarily required (about 100 µm or more), the pattern is formed via the desired shaped mask during vapor deposition or sputtering of the above electrode materials.

Alternately, in case where materials such as organic electrically conductive compounds, which can be used for coating, are employed, wet system film making methods such as a printing system and a coating system can also be employed. In case where light is taken out from the above anode, transmittance is desirably 10% or more, and sheet resistance as the anode is preferably a few hundred Ω/□ or less. Further, the film thickness, depending on materials, is commonly selected from the range of 10 to 1,000 nm, preferably from the range of 10 to 200 nm.

<<Cathode>>

On the other hand, as a cathode, metal (referred to as electron injecting metals), alloys, electrically conductive compounds, and mixtures thereof, which exhibit a relatively low work function (4 eV or less) are employed as electrode materials.

Specific examples of such electrode materials include sodium, a sodium-potassium alloy, magnesium, lithium, a magnesium/copper mixture, a magnesium/silver mixture, a magnesium/aluminum mixture, a magnesium/indium mixture, an aluminum/aluminum oxide ($Al_2O_3$) mixture, indium, a lithium/aluminum mixture, and rare earth metals.

Of these, in view of electron injection capability and resistance to oxidation, suitable are mixtures of an electron injecting metal and a second metal exhibiting higher work function and more stable than the above electron injecting metal, such as a magnesium/silver mixture, a magnesium/aluminum mixture, a magnesium/indium mixture, an aluminum/aluminum oxide ($Al_2O_3$) mixture, a lithium/aluminum mixture, or aluminum.

The cathode can be prepared via formation of a thin film of the above electrode materials employing methods such as vapor deposition or sputtering. Sheet resistance as the cathode is preferably a few hundred Ω/□ or less. Further, the film thickness is commonly selected from the range of 10 nm to 5 µm, preferably from the range of 50 to 200 nm.

In order to transmit the emitted light, it is advantageous that either the anode or the cathode is transparent or translucent to enhance the light emission luminance.

Further, a transparent or translucent cathode can be prepared in such a manner that, after preparing the above metal film exhibiting a thickness of 1 to 20 nm on the cathode, electrically conductive transparent materials, listed in the description of the anode, are prepared on the above, film. By applying the above, it is possible to prepare an element in which both the anode and the cathode exhibit transparency.

<<Method for Preparing Organic EL Element>>

As one example of the method for preparing the organic EL element of the present invention, there is described a method for preparing an organic EL element composed of an anode/a hole injection layer/a hole transporting layer/a light emitting layer/a hole blocking layer/an electron transporting layer/a cathode.

Initially, a thin film composed of desired electrode materials such as anode materials is formed via methods such as vapor deposition or sputtering to a film thickness of 1 µm or less, preferably 10 to 200 nm to prepare an anode. Subsequently, on the above, there are formed thin films of organic compounds, which are materials for an organic EL element, composed of a hole injection layer, a hole transporting layer, a light emitting layer, a hole blocking layer, and an electron transporting layer.

Methods for forming a thinner film of the above organic compound thin film include, as described above, a vapor deposition method and wet processes (such as a spin coating method, a casting method, an ink-jet method, or a printing method). In view of easier formation of a homogeneous film and inhibition of pin hole formation, particularly preferred are the vacuum vapor deposition method, the spin coating method, the ink-jet method, and the printing method. Further, different film making methods may be applied to each of the layers.

When the vapor deposition method is employed for making film, the vapor deposition conditions differ depending on the type of employed compounds. However, it is desirable to commonly select suitable conditions from the following ranges: a boat heating temperature of 50 to 450° C., a degree of vacuum is $10^{-6}$ to $10^{-2}$ Pa, a deposition rate of 0.01 to 50 nm/second, a substrate temperature of −50 to 300° C., a film thickness of 0.1 nm to 5 µm, preferably 5 to 200 nm.

After formation of these layers, a thin film composed of cathode materials is formed on the resulting layers to a film thickness of 1 µm or less, preferably in the range of 50 to 200 nm, employing a method such as vapor deposition or sputtering to provide a cathode, whereby an intended organic EL element is prepared.

In the above preparation of organic EL elements, it is preferable that preparation steps from the hole injecting layer to the cathode is continuously carried out through a single vacuuming. However, the above element may be taken out in mid-stream of the process and a different film making method may be employed. In this case, careful considerations are required such that the preparation is carried out in a dry inert gas atmosphere.

Further, by reversing the above preparation order, it is possible to carry out the preparation in the order of a cathode, an electron injection layer, an electron transporting layer, a light emitting layer, a hole transporting layer, a hole injection layer, and an anode. When direct current voltage is applied to the multicolor display device thus prepared, by applying a voltage of about 2 to about 40 V with the anode being positive and the cathode being negative, light emission can be observed. Further, alternating current voltage may be applied, of which the waveform of the applied alternating current is not limited.

It is commonly stated that in an organic electroluminescent element, light emission occurs in the layer exhibiting a higher refractive index (about 1.6 to about 2.1) than that of air, and only about 15 to about 20% of light emitted in the light emitted layer can be taken out. The reasons for that are that incident light to the interface (the interface between the transparent substrate and air) at an angle of θ, which is greater than the critical angle, is totally reflected, whereby no light is taken out to the exterior of the element, and light is totally reflected between the transparent electrode or the light emitting layer and the transparent substrate so that the light is guided through the transparent electrode or the light emitting layer, to result in the light being scattered in the side directions of the element.

Means for improving light taking-out efficiency include, for example, a method in which irregularity is formed on the surface of the transparent substrate so that total reflection at the interface between the transparent substrate and air is prevented (for example, U.S. Pat. No. 4,774,435); a method in which efficiency is enhanced by allowing the substrate to exhibit light focusing properties (for example, JP-A No. 63-314795); a method in which a reflective surface is formed on the side of the element (for example, JP-A No. 1-220394); a method in which a flat layer exhibiting an intermediate refractive index is introduced between the substrate and the light emitting body, whereby an reflection inhibiting film is formed (for example, JP-A No. 62-172691); a method in which a flat layer exhibiting a lower refractive index than that of the substrate is introduced between the substrate and the light emitting body (for example, JP-A No. 2001-202827); and a method in which a diffraction grating is arranged between any layers of the substrate, the transparent electrode layer and the light emitting layer (including between the substrate and the exterior) (JP-A No. 11-283751).

In the present invention, the above methods can be employed in combination with the electroluminescent element of the present invention. However, there can be preferably used a method in which a flat layer exhibiting a lower refractive index than that of the substrate is introduced between the substrate and the light emitting body, or a method in which a diffraction grating is arranged between any layers of the substrate, the transparent electrode layer and the light emitting layer (including between the substrate and the exterior).

By combining these methods, the present invention enables preparation of an element which exhibits higher luminance and excellent durability.

By forming, between the transparent electrode and the transparent substrate, a medium of a low refractive index at a thickness greater than the wavelength of light, light emitted from the transparent electrode results in higher light taking-out efficiency to the exterior as the refractive index of the medium decreases.

Examples of the low refractive index layers include aerogel, porous silica, magnesium fluoride, and fluorine based polymers. Since the refractive index of the transparent substrate is commonly about 1.5 to about 1.7, the refractive index of the low refractive index layer is preferably about 1.5 or less, more preferably 1.35 or less.

Further, the thickness of the low refractive index medium is preferably twice the wavelength in the medium or more. The reason is that when the thickness of the low refractive index medium becomes about light wavelength, whereby electromagnetic wave exuded via evernescent enters into the substrate, effects of the low refractive index layer are reduced.

The method for introducing the diffraction grating into an interface causing total reflection or any of the media is characterized in that the method exhibits an enhanced effect of the light taking-out efficiency. The method is to diffract light not capable of going out to the exterior of the layers due to the total reflection between layers, among light generated from the light emitting layer, by introducing the diffraction grating between any of layers or into the medium (in the transparent substrate or the transparent electrode) to take out light, by utilizing properties of the diffraction grating in which the direction of light can be changed to a specified direction differing from a diffraction direction via so-called Bragg diffraction, such as primary diffraction or secondary diffraction.

It is desirable that the diffraction grating to be introduced has a two-dimensional cyclic refractive index. The reason for that is that, since the light emitting layer randomly emits light in all directions, a common one-dimensional diffraction grating having a cyclic refractive index distribution only in a certain direction diffracts light traveling only in a specific direction, whereby light taking-out efficiency is not so enhanced.

However, when the refractive indices are two-dimensionally distributed, light traveling in all directions is diffracted, whereby light taking-out efficiency is enhanced.

The location where the diffraction grating is introduced may be between any layers or in a medium (in a transparent substrate or a transparent electrode), but a proximity of the organic light emitting layer where light is generated is preferred. In such a case, the cycle of the diffraction grating is preferably about ½ to about 3 times the wavelength of the light in the medium. Regarding the arrangement of the diffraction grating, arrangements such as a square lattice shape, a triangle lattice shape, or a honeycomb shape are preferred, in which arrangement thereof is two-dimensionally repeated.

In the organic electroluminescent element of the present invention, it is possible to enhance luminance in a specific direction in such a manner that the element is processed so as to arrange, for example, a microlens array-like structure on the light taking-out side of the support base (the base), or, light is collected in a specific direction, for example, in a front direction with regard to light emitting surface of the element, by combining with a so-called light focusing sheet.

An example of the microlens array is quadrangular pyramids with a side length of 30 μm and an apex angle of 90 degrees, which are two-dimensionally arranged on the light taking-out side of the substrate. The side length is preferably 10 to 100 μm. When the side length is smaller than the above, a diffraction effect occurs to result in undesired coloration, while when it is excessively longer, the thickness becomes thicker, which is not preferred.

As the focusing sheet, for example, those which have been put to practical use in LED backlights of liquid crystal display devices can be employed. As such a sheet, the luminance enhancing film (BEF) produced by Sumitomo 3M Co., Ltd. can be employed. As the prism sheet shape, for example, those which may be triangular stripes with the apex angle of 90 degrees and a pitch of 50 μm formed on the substrate, or may be stripes with shapes such as a rounded apex, pitches being randomly varied, and others.

Further, to control the radiation angle of light emitted from the organic EL element, the focusing sheet may be employed in combination with a light diffusion plate/film. For example, the light diffusion film (LIGHT-UP) produced by Kimoto Co., Ltd. can be employed.

<<Industrial Fields to which the Organic EL Element of the Present Invention is Applicable>>

The organic EL element of the present invention can be employed as display devices, displays, and various light emitting sources. Examples of light emitting sources include home lighting, lighting in vehicles, backlights for clocks and liquid crystals, commercial signboards, traffic lights, light sources for optical memory media, light sources for electrophotographic copiers, light sources for optical communication processors, and light sources for optical sensors, but are not limited thereto. In particular, it is possible to effectively employ the above element as a backlight or light sources for lighting for various display devices combined with a color filter, a light diffusing plate, or a light taking-out film.

Hereinafter, one embodiment of the lighting device provided with the organic EL element of the present invention is described referring to drawings <<Lighting Device>>

The lighting device having the organic EL element of the invention will be described.

An organic EL element of this invention can be employed as an organic EL element provided with a resonator structure, and a utilization purpose of such an organic EL element provided with a resonator structure includes light sources for optical memory media, light sources for electrophotographic copiers, light sources for optical communication processors, and light sources for optical sensors, but are not limited thereto. Further, the above element may be used to the above purposes by causing laser oscillation.

Further, the organic EL element of this invention may be used as a kind of lamp for an illumination or like an exposure light source, and may also be employed as a projection apparatus of a type of an image projection or as a display device (a display) of a type to directly view still images and moving images.

An operating mode in the case of being used as a display device for playback of moving images may be either a simple matrix (a passive matrix) mode or an active matrix mode. In addition, a full-color display device can be prepared by employing at least two types of the organic EL elements of the present invention exhibiting different emitted light colors.

Further, the combination of the light emitting materials to obtain a plurality of emitted light colors may be either a combination of a plurality materials which emit light as a plurality of phosphorescent light or fluorescent light, or a combination of light emitting materials which emit light as fluorescent light or phosphorescent light and dye materials which emit light as an excited light of light emitted from the light emitting materials. However, in the white organic EL element relating to the present invention, a plurality of the light emitting dopants may only be combined and mixed.

A mask is provided only at a time of formation of layers such as a light emitting layer, a hole transporting layer or an electron transporting layer, and is just simply arranged in such a manner that layers are differently coated by the mask. Since other layers are common, patterning such as a mask is unnecessary, and, for example, an electrode can be formed on the whole surface via methods such as vapor deposition, spin coat, inkjet, and printing, whereby productivity is also increased.

According to the above method, differing from a white organic EL device, in which light emitting elements having a plurality of colors are parallelly arranged in an array form, the element itself emits white.

The light emitting materials employed for the light emitting layer are not particularly limited, and in case of a backlight used in a liquid display element, white light can be achieved by selecting any materials among the metal complexes relating to the present invention or commonly known light emitting materials and the selected materials are combined so that the materials fit to the wavelength region corresponding to the CF (color filter) characteristics.

One embodiment of the lighting device of the present invention which is provided with the organic EL element of the present invention will be described.

The non-light emitting side of the organic EL element of the present invention was covered with a glass case. Using a glass base of 300 μm in thickness as a sealing base, the above glass case with the organic EL element being inside was put over the above-described cathode, and close contacted with the transparent support base by applying an epoxy type light curable adhesive (LUX TRACK LC0629B; produced by TOAGOSEI CO., LTD.) as a sealant to the surroundings of the edges of the glass case. Then, the light curable adhesive was irradiated by UV light from the glass base side, to cure the adhesive, and then the organic EL element was sealed, to form a lighting device as shown in FIGS. 1 and 2.

FIG. 1 shows a schematic view of the lighting device, and organic EL element 101 of the present invention is covered with glass cover 102 (the sealing work using the glass cover was achieved in a glove box in a nitrogen gas atmosphere (in an atmosphere with high purity nitrogen gas of 99.999% or more) without allowing organic EL element 101 to come in contact with air).

Figure 2:
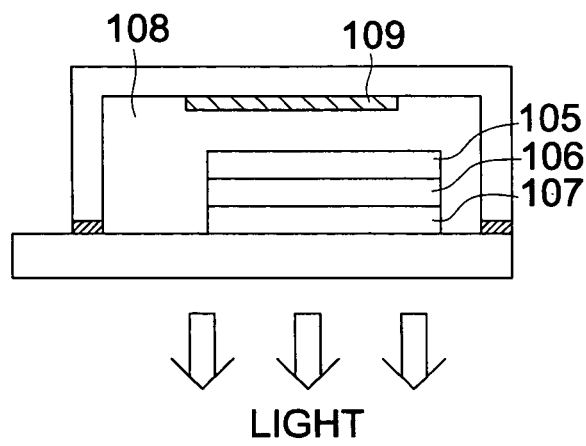
FIG. 2 is a schematic sectional view of the lighting device.

FIG. 2 shows a schematic sectional view of the lighting device. In FIG. 2, the numeral 105 is a cathode, the numeral 106 is an organic EL layer, and the numeral 107 is a glass base equipped with a transparent electrode. The interior of glass cover 102 is charged with nitrogen gas 108, and is provided with moisture absorbing material 109.

In the following, one example of a display device provided with an organic EL element of the present invention will be described referring to drawings.

Figure 3:
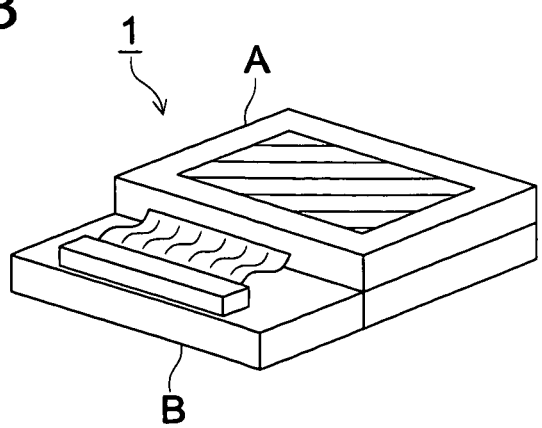
FIG. 3 is a schematic view showing an example of a display constituted by the organic EL element.

FIG. 3 is a schematic view showing an example of a display device constituted of the organic EL element. It is a schematic view of a display such as a mobile phone, which displays image information by light emission of the organic EL element.

Display 1 is constituted of sections such as display section A having a plurality of pixels, and control section B which performs image scanning of display section A based on image information.

Control section B is electrically connected to display section A, and sends a scanning signal and an image data signal to each of a plurality of pixels based on image information from the outside, and the pixels of each scanning line successively emit light corresponding to the image data signal by a scanning signal and image scanning is carried out, whereby image information is displayed on display section A.

FIG. 4 is a schematic drawing of display section A.

Display section A is provided on a substrate with a wiring section, which contains a plurality of scanning lines 5 and data lines 6, and a plurality of pixels 3. Primary members of display section A will be described below.

In the drawing, a case where light emitted by pixel 3 is taken out in the direction of the white allow (downward) is shown.

Each of scanning lines 5 and a plurality of data lines 6 on the wiring section are composed of an electroconductive material. Scanning lines 5 and data lines 6 cross each other at right angles in a grid-like fashion, and both kinds of lines are connected to pixels 3 at the crossing points (the details are not illustrated).

Each pixel 3 receives an image data signal from data line 6 when scanning signals are applied from scanning line 5, whereby each pixel emits light based on the received image data.

Next, the light emitting process of the pixel will be described.

Figure 5:
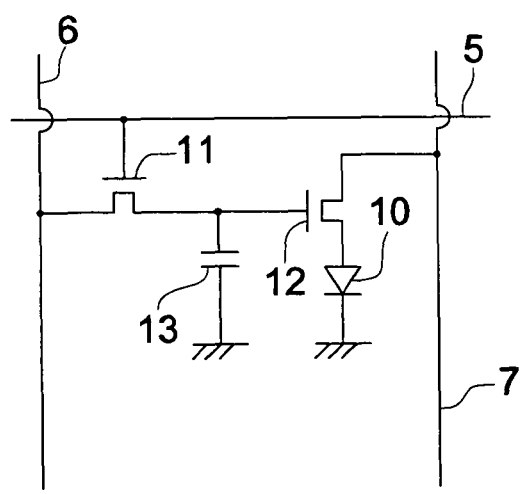
FIG. 5 is a pattern diagram of a pixel.

FIG. 5 is a schematic drawing of the pixel.

The pixel is provided with organic EL element 10, switching transistor 11, driving transistor 12, and condenser 13.

In FIG. 5, image data signals are applied from control section B to the drain of the switching transistor through data line 6. Subsequently, when the scanning signals are applied from control section B to the gate of switching transistor through the scanning line 5, the driving of switching transistor 11 turned ON, and then the image date signals applied to the drain are transferred to condenser 13 and the gate of driving transistor 12.

By the transfer of the image data signals, condenser 13 is charged corresponding to the potential of the image data signals, and at the same time the driving of driving transistor 12 is turned ON. The drain of driving transistor 12 is connected to power source line 7, and the source of driving transistor 12 is connected to the electrode of organic EL element 10, and then electric current is supplied from power source line 7 to organic EL element 10 corresponding to the potential of the image data signals applied to the gate.

When the scanning signal is moved to the next scanning line 5 by the successive scanning by control section B, the driving of switching transistor 11 is turned OFF. However, since condenser 13 holds the charged potential of the image data signal even when the driving of switching transistor 11 is turned OFF, the driving of driving transistor 12 is kept at ON state, and the light emission of organic EL element 10 continues until the next scanning signal is applied.

When the next scanning signal is applied by the successive scanning, driving transistor 12 is driven corresponding to the potential of the next image data signals synchronized with the scanning signals, whereby organic EL element 10 emits light.

Namely, in the light emission of organic EL element 10, the light emission of organic EL element 10 of each of the plurality of pixels 3 is achieved by providing switching transistor 11 as an active element and driving transistor 12 to organic EL element 10 of each of the plurality of pixels. Such a light emission system is referred to as the active matrix system.

The light emission of organic EL element 10 may be light emission with a plurality of gradations based on multi-value image data signal having a plurality of gradation potentials, or on-off of the predetermined amount of light emission according to the binary image data signal.

The potential of the condenser 13 may be held until application of the next scanning signal, or discharged just before the application of the next scanning signal.

In the present invention, the light emission driving is not limited to the above-described active matrix system, but the light emission driving of the passive matrix system may be preformed, in which the organic EL element is allowed to emit light corresponding to data signal only when the scanning signal is scanned.

Figure 6:
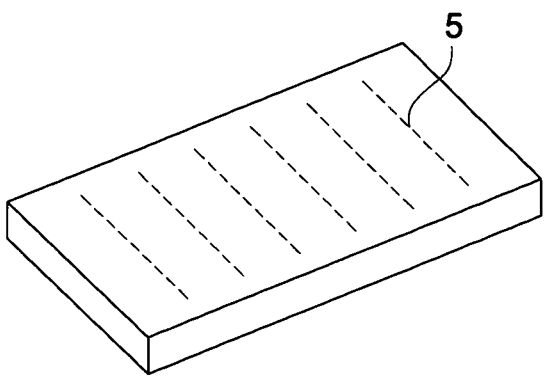
FIG. 6 is schematic views of a full color display of passive matrix system.
Figure 6:
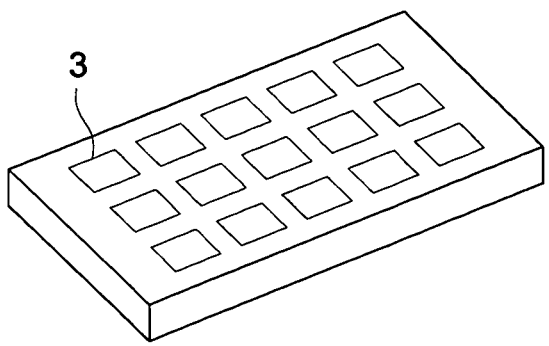
Figure 6:
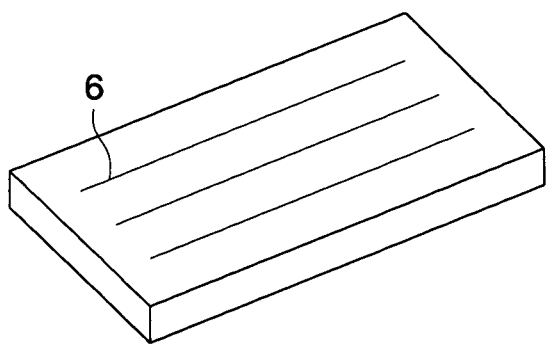

FIG. 6 is a schematic drawing of a display device by the passive matrix system. In FIG. 6, a plurality of scanning lines 5 and a plurality of image data lines 6 are provided facing each other to sandwich pixels 3 so as to form lattices.

When the scanning signal is applied to scanning line 5 by successive scanning, pixel 3 connected to above scanning line 5, to which the signal is applied, emits light corresponding to the image data signal.

In the passive matrix system, pixel 3 has no active element resulting in the reduced production cost.

EXAMPLES

The invention is described with reference to examples, but the invention is not limited to them.

Compounds employed in the examples are described below.

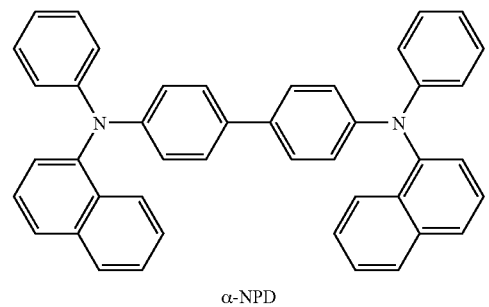

α-NPD

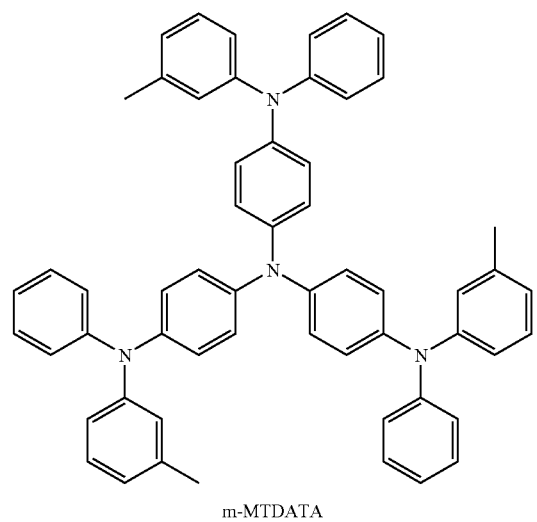

m-MTDATA

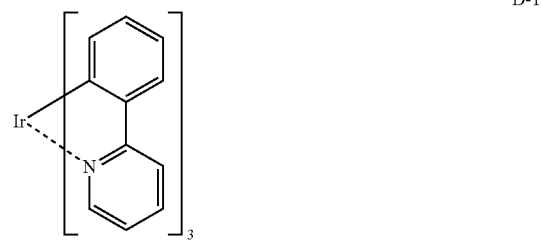

D-1

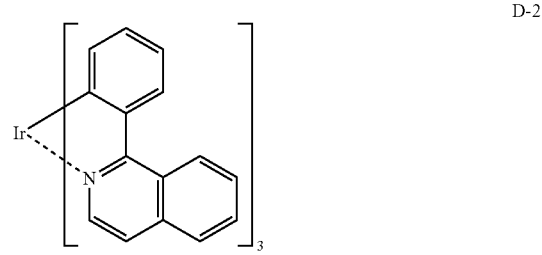

D-2

-continued

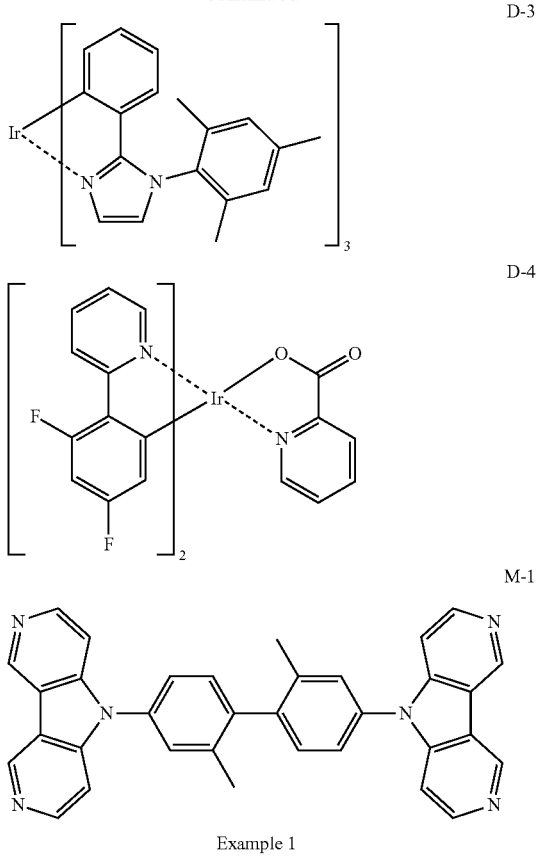

Example 1

<<Preparation of Organic Electroluminescent Element>>
[Preparation of Organic Electroluminescent Element 1]

A 120 nm thick ITO (indium tin oxide) film was formed as an anode on a glass base of 30 mm by 30 mm and 0.7 mm thick. The resulting support base was subjected to patterning. Thereafter, the transparent support base, fitted with the above ITO transparent electrode, was subjected to ultrasonic cleaning employing isopropyl alcohol, dried with nitrogen gas, and then subjected to UV ozone cleaning over 5 minutes. Thereafter, the resulting transparent support base was fixed to the base holder in a plasma treatment chamber which was connected to a commercial vacuum deposition apparatus.

Further, in each crucible for vapor deposition in the vacuum deposition apparatus, each of the materials constituting each layer was added in an optimum amount for preparation of each element. The crucible employed for vapor deposition was made of resistance heating materials such as molybdenum or tungsten.

A substrate was subjected to a plasma treatment for two minutes at an oxygen pressure of 1 Pa and a power of 100 W (the electrode area of approximately 450 cm$^2$), after which the resulting base was transferred to an organic layer deposition chamber without being exposed to ambient atmosphere, and then film formation of an organic layer was carried out.

Initially, after the pressure was reduced to a vacuum degree of $1\times10^{-4}$ Pa, the above crucible for vapor deposition, in which m-MTDATA was placed, was heated by applying an electric current, whereby the m-MTDATA was deposited onto the transparent support base at a deposition rate of 0.1 nm/second to form a 10 nm hole injection layer. Subsequently, α-NPD was deposited in the same manner as above to form a 30 nm hole transporting layer.

Subsequently, each light emitting layer was provided according to the steps described below.

Compounds D-1 and a-7 were simultaneously deposited at a deposition rate of 0.1 nm/second to a concentration of D-1, of 5% by mass, to form a green phosphorescent light emitting layer (Light emitting layer 1 listed in Table 2) exhibiting a maximum light emitting wavelength of 518 nm, and a thickness of 5 nm.

Subsequently, Compounds D-2 and a-7 were simultaneously deposited at a deposition rate of 0.1 nm/second to a concentration of D-2 of 8% by mass, to form a red phosphorescent light emitting layer (Light emitting layer 2 listed in Table 2) exhibiting a maximum light emitting wavelength of 622 nm, and a thickness of 10 nm. Further, compounds 1-79 and a-7 were simultaneously deposited at a deposition rate of 0.1 nm/second to a concentration of 1-79 of 9% by mass, to form a blue phosphorescent light emitting layer (Light emitting layer 3 listed in Table 3) exhibiting a maximum light emitting wavelength of 470 nm, and a thickness of 20 nm.

Thereafter, compound M-1 was deposited to result in a thickness of 10 nm to form a hole blocking layer. Further, CsF was simultaneously deposited together with compound M-1 to a thickness ratio of 10%, to form an electron transport layer exhibiting a thickness of 45 nm.

Further, a cathode was formed by depositing aluminum to a thickness of 110 nm, to prepare organic EL element 1.
[Preparation of Organic Electroluminescent Elements 2 to 12]

Each of organic EL elements 2 to 12 was prepared in a similar manner to the preparation of organic EL element 1 except that the light emitting material, the host compound, the dope concentration, and the film thickness of light emitting layers 1 to 4 were changed to those described in Tables 2 and 3.

TABLE 2

| | Light emitting layer 1 | | | | | Light emitting layer 2 | | | |
|---|---|---|---|---|---|---|---|---|---|
| | Light emitting material | *1 | Host compound | Layer thickness [nm] | Maximum light emitting wavelength [nm] | Light emitting material | *1 | Host compound | Layer thickness [nm] | Maximum light emitting wavelength [nm] |
| 1 (Comp.) | D-1 | 5 | a-7 | 5 | 518 | D-2 | 8 | a-7 | 10 | 622 |
| 2 (Comp.) | D-1 | 5 | a-7 | 5 | 518 | D-3 | 8 | a-7 | 10 | 595 |
| 3 (Comp.) | D-1 | 5 | a-7 | 5 | 518 | D-2 | 8 | a-7 | 5 | 622 |
| 4 (Inv.) | D-1 | 10 | a-7 | 8 | 518 | 1-79 | 9 | a-7 | 20 | 473 |
| | D-2 | 1 | | | 622 | | | | | |
| 5 (Inv.) | D-1 | 10 | a-7 | 8 | 518 | 1-79 | 9 | a-7 | 20 | 473 |
| | D-2 | 1 | | | 622 | | | | | |
| 6 (Inv.) | D-1 | 10 | a-7 | 8 | 518 | 1-79 | 9 | a-7 | 20 | 473 |
| | D-3 | 1 | | | 595 | | | | | |

TABLE 2-continued

| | Light emitting layer 1 | | | | Light emitting layer 2 | | | | |
| --- | --- | --- | --- | --- | --- | --- | --- | --- | --- |
| | Light emitting material | *1 | Host compound | Layer thickness [nm] | Maximum light emitting wavelength [nm] | Light emitting material | *1 | Host compound | Layer thickness [nm] | Maximum light emitting wavelength [nm] |
| 7 (Inv.) | D-1<br>D-3 | 10<br>1 | a-7 | 8 | 518<br>595 | 1-90 | 9 | a-7 | 20 | 473 |
| 8 (Inv.) | D-1<br>D-3 | 10<br>1 | a-7 | 8 | 518<br>595 | D-4 | 9 | a-7 | 20 | 470 |
| 9 (Inv.) | D-1<br>D-2 | 10<br>1 | a-7 | 8 | 518<br>622 | 1-79 | 9 | a-7 | 15 | 473 |
| 10 (Inv.) | D-1<br>D-2 | 10<br>1 | a-7 | 8 | 518<br>622 | 1-79<br>D-3 | 10<br>1 | a-7 | 15 | 473<br>595 |
| 11 (Comp.) | D-1<br>D-2 | 10<br>1 | a-7 | 8 | 518<br>622 | 1-79 | 9 | a-7 | 20 | 473 |
| 12 (Comp.) | D-2 | 8 | a-7 | 8 | 622 | 1-79 | 9 | a-7 | 20 | 473 |

*1: Dope concentration [% by mass], Comp.: Comparative example
Inv.: Present invention

TABLE 3

| | Light emitting layer 3 | | | | | Light emitting layer 4 | | | | |
| --- | --- | --- | --- | --- | --- | --- | --- | --- | --- | --- |
| | Light emitting material | *1 | Host compound | Layer thickness [nm] | Maximum light emitting wavelength [nm] | Light emitting material | *1 | Host compound | Layer thickness [nm] | Maximum light emitting wavelength [nm] |
| 1 (Comp.) | 1-79 | 9 | a-7 | 20 | 470 | — | — | — | — | — |
| 2 (Comp.) | 1-79 | 9 | a-7 | 20 | 470 | — | — | — | — | — |
| 3 (Comp.) | D-3 | 8 | a-7 | 5 | 595 | 1-79 | 9 | H-1 | 20 | 470 |
| 4 (Inv.) | D-3 | 8 | a-7 | 10 | 595 | — | — | — | — | — |
| 5 (Inv.) | D-1<br>D-3 | 10<br>1 | a-7 | 5 | 518<br>595 | — | — | — | — | — |
| 6 (Inv.) | D-1<br>D-2 | 10<br>1 | a-7 | 5 | 518<br>622 | — | — | — | — | — |
| 7 (Inv.) | D-1<br>D-2 | 10<br>1 | a-7 | 5 | 518<br>622 | — | — | — | — | — |
| 8 (Inv.) | D-1<br>D-2 | 10<br>1 | a-7 | 5 | 518<br>622 | — | — | — | — | — |
| 9 (Inv.) | 1-79<br>D-3 | 10<br>1 | a-7 | 8 | 518<br>595 | — | — | — | — | — |
| 10 (Inv.) | — | — | — | — | — | — | — | — | — | — |
| 11 (Comp.) | — | — | — | — | — | — | — | — | — | — |
| 12 (Comp.) | — | — | — | — | — | — | — | — | — | — |

*1: Dope concentration [% by mass], Comp.: Comparative example
Inv.: Present invention <<Evaluation of Organic Electroluminescent Elements>>

In evaluation of the obtained organic EL elements 1 to 12, each of the lighting devices provided, with the organic EL element as shown in FIGS. 1 and 2 was prepared, and then the characteristics of the device were evaluated.

[Determination of Electric Power Efficiency]

The front luminance and the angular dependence of luminance of each organic EL element were determined employing spectroradiometric luminance meter CS-1000 (produced by Konica Minolta Sensing Inc.), and the electric power efficiency at a front luminescence of 1,000 cd/m² was determined. In Table 4, relative values are listed with the electric power efficiency of organic EL element 1 being 100.

[Determination of Color Rendering Properties and Color Gamut Ratio]

The light emission spectra at a front luminance of 1,000 cd/m² was determined via spectroradiometric luminance meter CS-1000 (produced by Konica Minolta Sensing Inc.). From the data thus obtained, the average color rendering index (Ra) and the color gamut ratio (Ga) were calculated, according to a method based on JIS Z 8726-1990. The calculated values thus obtained were given in Table 4 with ranks defined as below.

[Color Rendering Properties]

A: Ra≧70 (The sample is excellent in color rendering properties, and sufficient for practical use.)

B: Ra≧60 (The sample is slightly inferior in color rendering properties.)

C: Ra<60 (The sample is highly inferior in color rendering properties, and by no means practical.)

[Color Gamut Ratio]

A: Ga≧80 (The sample exhibits a wide color gamut, and vivid colors, and is sufficient for practical use.)

B: Ga≧70 (The sample is slightly inferior in practical use.)

C: Ga<70 (The sample exhibits a narrow color gamut, and is by no means practical.)

[Evaluation of Chromaticity Stability during Electric Current Density Fluctuation]

Chromaticity of each of the organic EL elements obtained when the element is applied with electric current density of 1 mA/cm² and that obtained with electric current density of 5 mA/cm² were determined via spectroradiometric luminance meter CS-1000 (produced by Konica Minolta Sensing Inc.), and the chromaticity difference ΔE was calculated from a formula below.

In the formula below, x and y are chromaticity x and y in CIE 1931 Color Specification system.

$$\Delta E=(\Delta x^2+\Delta y^2)^{1/2}$$

[Evaluation of Chromaticity Stability with the Passage of Time of Driving]

Luminance variation during continuous driving was traced employing a front luminance of 4,000 cd/m² as an initial luminance. Chromaticity at t=0 and chromaticity at a time when the luminance decreased by half were determined via spectroradiometric luminance meter CS-1000 (produced by Konica Minolta Sensing Inc.)', and resulting chromaticity difference ΔE was calculated from a formula below.

In the formula below, x and y are chromaticity x and y in CIE 1931 Color Specification system.

$$\Delta E=(\Delta x^2+\Delta y^2)^{1/2}$$

TABLE 4

|  | Power efficiency | Color rendering properties | Color gamut | Chromaticity change during electric current density fluctuation [ΔE] | Chromaticity change with the passage of time of driving [ΔE] |
| --- | --- | --- | --- | --- | --- |
| 1 (Comparative example) | 100 | C | A | 0.06 | 0.07 |
| 2 (Comparative example) | 105 | B | B | 0.06 | 0.07 |
| 3 (Comparative example) | 80 | A | A | 0.07 | 0.08 |
| 4 (Present invention) | 130 | A | A | 0.02 | 0.03 |
| 5 (Present invention) | 145 | A | A | 0.02 | 0.02 |
| 6 (Present invention) | 150 | A | A | 0.01 | 0.02 |
| 7 (Present invention) | 142 | A | A | 0.02 | 0.03 |
| 8 (Present invention) | 145 | A | A | 0.02 | 0.05 |
| 9 (Present invention) | 130 | A | A | 0.02 | 0.03 |
| 10 (Present invention) | 155 | A | A | 0.01 | 0.02 |
| 11 (Comparative example) | 130 | C | B | 0.05 | 0.08 |
| 12 (Comparative example) | 109 | C | C | 0.05 | 0.09 |

As clearly shown from the results described in Table 4, compared to the comparative elements, the organic electroluminescent elements of the present invention exhibit high electric power efficiency, and are excellent in color rendering properties and color gamut, and also exhibit excellent color stability during electric current density fluctuation and passage of time of the driving period.

What is claimed is:

1. An organic electroluminescent element comprising a substrate, an anode, a cathode, and three light-emitting layers being sandwiched between the anode and the cathode, the light-emitting layers being operable for emitting white light, wherein the three light-emitting layers in their entirety consist of four kinds of light-emitting materials and optionally at least one host material, said four kinds of light-emitting materials are as follows:

a blue light-emitting material having an emission maximum wavelength (λ max) of 430 to 480 nm, a green light-emitting material having an emission maximum wavelength (λ max) of 510 to 560 nm, a yellow-red light-emitting material having an emission maximum wavelength (λ max) of 570 to 610 nm, and a red light-emitting material having an emission maximum wavelength (λ max) of 610 to 650 nm, wherein the green light-emitting material, the yellow-red light-emitting material and the red light-emitting material each is a phosphorescent light-emitting material, and the blue light-emitting material is a phosphorescent light-emitting compound represented by the following Formula (1):

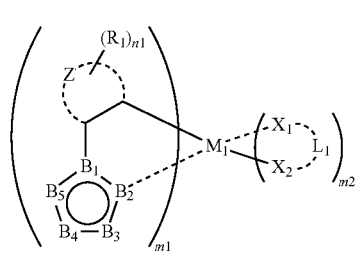

Formula (1)

wherein $R_1$ represents a substituent; Z represents a non-metal atom group necessary to form a 5- to 7-membered ring; n1 represents an integer of 0 to 5; each of $B_1$ to $B_5$ independently represents a carbon atom, a nitrogen atom, an oxygen atom or a sulfur atom, wherein at least one of $B_1$ to $B_5$ represents a nitrogen atom; $M_1$ represents a metal of Groups 8 to 10 of the Periodic Table of the Elements; each of $X_1$ and $X_2$ independently represents a carbon atom, a nitrogen atom, or an oxygen atom; $L_1$, together with $X_1$ and $X_2$, represents a group of atoms to form a bidentate ligand; m1 is an integer of 1 to 3, and m2 is an integer of 0 to 2, wherein the sum of m1 and m2 is 2 or 3, and the green light-emitting material and the red light-emitting material are simultaneously incorporated in a light-emitting layer located on the anode side of a blue light-emitting layer; and the green light-emitting material and the yellow-red light-emitting material are simultaneously incorporated in a light-emitting layer located on the cathode side of the blue light-emitting layer.

2. An organic electroluminescent element comprising a substrate, an anode, a cathode, and three light-emitting layers sandwiched between the anode and the cathode, the light-emitting layers operable for emitting white light, wherein the three light-emitting layers in their entirety consist of four kinds of light-emitting materials and optionally at least one host material, said four kinds of light-emitting materials are as follows:

a blue light-emitting material having an emission maximum wavelength ($\lambda$ max) of 430 to 480 nm, a green light-emitting material having an emission maximum wavelength ($\lambda$ max) of 510 to 560 nm, a yellow-red light-emitting material having an emission maximum wavelength ($\lambda$ max) of 570 to 610 nm, and a red light-emitting material having an emission maximum wavelength ($\lambda$ max) of 610 to 650 nm, wherein the green light-emitting material, the yellow-red light-emitting material and the red light-emitting material each is a phosphorescent light-emitting material, and the blue light-emitting material is a phosphorescent light-emitting compound represented by the following Formula (1);

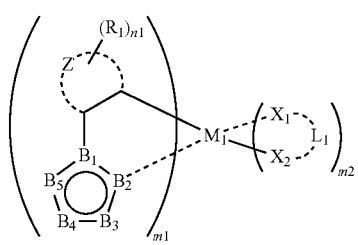

Formula (1)

wherein $R_1$ represents a substituent; Z represents a non-metal atom group necessary to form a 5- to 7-membered ring; n1 represents an integer of 0 to 5; each of $B_1$ to $B_5$ independently represents a carbon atom, a nitrogen atom, an oxygen atom or a sulfur atom, wherein at least one of $B_1$ to $B_5$ represents a nitrogen atom; $M_1$ represents a metal of Groups 8 to 10 of the Periodic Table of the Elements; each of $X_1$ and $X_2$ independently represents a carbon atom, a nitrogen atom, or an oxygen atom; $L_1$, together with $X_1$ and $X_2$, represents a group of atoms to form a bidentate ligand; m1 is an integer of 1 to 3, and m2 is an integer of 0 to 2, wherein the sum of m1 and m2 is 2 or 3, and a green light-emitting material and a yellow-red light-emitting material are simultaneously incorporated in a light-emitting layer located on the anode side of a blue light-emitting layer; and a green light-emitting material and a red light-emitting material are simultaneously incorporated in a light-emitting layer located on the cathode side of the blue light-emitting layer.

3. The organic electroluminescent element of claim 1, wherein identical host materials are incorporated in the light-emitting layers.

4. The organic electroluminescent element of claim 1, wherein $R_1$ represents an alkyl group, a cycloalkyl group, an alkenyl group, an alkynyl group, an aromatic hydrocarbon ring group, an aromatic heterocyclic group, a heterocyclic group, an alkoxyl group, a cycloalkoxy group, an aryloxy group, an alkylthio group, a cycloalkylthio group, an arylthio group, an alkoxycarbonyl group, an aryloxycarbonyl group, a sulfamoyl group, an acyl group, an acyloxy group, an amide group, a carbamoyl group, a ureido group, a sulfinyl group, an alkylsulfonyl group, an arylsulfonyl group, a heteroarylsulfonyl group, an amino group, a cyano group, a nitro group, a hydroxyl group, a mercapto group, or a silyl group.

5. The organic electroluminescent element of claim 2, wherein identical host materials are incorporated in the light-emitting layers.

6. The organic electroluminescent element of claim 1, wherein a layer thickness of the blue light emitting layer is in the range of 5 nm to 20 nm.

7. The organic electroluminescent element of claim 2, wherein a layer thickness of the blue light emitting layer is in the range of 5 nm to 20 nm.

* * * * *